(12) United States Patent
Hsueh et al.

(10) Patent No.: US 11,249,392 B2
(45) Date of Patent: Feb. 15, 2022

(54) EUV RETICLE POD

(71) Applicant: GUDENG PRECISION INDUSTRIAL CO., LTD, New Taipei (TW)

(72) Inventors: Hsin-Min Hsueh, New Taipei (TW); Chia-Ho Chuang, New Taipei (TW); Cheng-Ju Lee, New Taipei (TW); Jeng-Jie Huang, New Taipei (TW)

(73) Assignee: GUDENG PRECISION INDUSTRIAL CO., LTD, New Taipei (TW)

( * ) Notice: Subject to any disclaimer, the term of this patent is extended or adjusted under 35 U.S.C. 154(b) by 0 days.

(21) Appl. No.: 16/857,197

(22) Filed: Apr. 24, 2020

(65) Prior Publication Data
US 2020/0249563 A1    Aug. 6, 2020

Related U.S. Application Data

(63) Continuation-in-part of application No. 15/880,243, filed on Jan. 25, 2018, now Pat. No. 10,670,976.
(Continued)

(51) Int. Cl.
*G03F 1/66* (2012.01)
*G03F 7/20* (2006.01)
*H01L 21/673* (2006.01)

(52) U.S. Cl.
CPC ............ *G03F 1/66* (2013.01); *G03F 7/70733* (2013.01); *H01L 21/67353* (2013.01); *H01L 21/67359* (2013.01)

(58) Field of Classification Search
CPC ......... H01L 21/67353; H01L 21/67359; G03F 1/66; G03F 7/70741; B65D 25/10; B65D 25/103
(Continued)

(56) References Cited

U.S. PATENT DOCUMENTS 5,305,878 A    4/1994   Yen
8,220,630 B1*  7/2012   Ku ............................ G03F 1/66
                                                          206/454
(Continued)

FOREIGN PATENT DOCUMENTS

JP    2002287332 A    10/2002
JP    2006103795 A    4/2006
(Continued)

*Primary Examiner* — Steven A. Reynolds
(74) *Attorney, Agent, or Firm* — ScienBiziP, P.C.

(57) ABSTRACT

An EUV reticle pod is provided. The pod includes an inner and an outer box assembly. The inner box assembly contained in the outer box assembly includes a base and a cover. The base has an upper surface and a surrounding wall. The upper surface includes a carry surface, at least one trench, and a first contacting surface. The EUV reticle is carried above the carry surface. The trench has a circular loop structure and its bottom is lower than the carry surface. The carry surface, the trench, and the first contacting surface are sequentially distributed from the center of the upper surface towards the surrounding wall. The cover has a concave for accommodating the EUV reticle and a second contacting surface for cooperating with the first contacting surface to form an air-tight seal. The trench captures and traps particles to reduce the particle contamination on the reticle.

16 Claims, 21 Drawing Sheets

Related U.S. Application Data

(60) Provisional application No. 62/450,172, filed on Jan. 25, 2017.

(58) Field of Classification Search
USPC .................. 206/710, 454, 711, 722, 723
See application file for complete search history.

(56) References Cited

U.S. PATENT DOCUMENTS

| | | | |
|---|---|---|---|
| 2011/0155598 A1* | 6/2011 | Lu ........................ | G03F 1/66 |
| | | | 206/349 |
| 2013/0010277 A1 | 1/2013 | Del Puerto et al. | |

FOREIGN PATENT DOCUMENTS

| | | | |
|---|---|---|---|
| JP | 200725183 | A | 2/2007 |
| JP | 2007153402 | A | 6/2007 |
| JP | 2013205690 | A | 10/2013 |
| JP | 201581947 | A | 4/2015 |
| JP | 2018120221 | A | 8/2018 |
| JP | 2020177215 | A | 10/2020 |
| TW | 201228902 | A | 7/2012 |
| TW | I666510 | B | 7/2019 |
| TW | I690771 | B | 4/2020 |

* cited by examiner

EUV RETICLE POD

RELATED APPLICATIONS

This application is a continuation-in-part of U.S. patent application Ser. No. 15/880,243 by Hsueh, et al., titled "EUV Reticle Pod," filed on Jan. 25, 2018, which claims priority to U.S. Provisional Patent Application No. 62/450,172, by Hsueh, et al., titled "Reticle Pod," filed on Jan. 25, 2017. The disclosure of the abovementioned priority documents are hereby incorporated by reference herein in their entirely.

BACKGROUND

1. Field

The present disclosure relates to a reticle pod. More particularly, the present disclosure relates to a dual containment EUV reticle pod.

2. Related Art

In recent years, the semiconductor manufacturing technology advances rapidly, in which the photolithography process plays an important role. Generally, photolithography involves fabricating a light permeable reticle with desired pattern and projecting the pattern onto a wafer having photoresist by exposing to a light source. After etching and other process steps, the desired pattern is formed on the wafer.

During the photolithography process, any particle attached on the wafer, such as dust or organic matters, would deteriorate the image quality projected onto the wafer. However, the industry trend now moves towards the production of chips that are smaller in size and with a higher logic density. The wavelength of the light source used by the photolithography equipment is narrowed down to the range of extreme ultraviolet light (EUV). As a result, stricter requirements for particle number, particle size, and the internal cleanliness of the reticle pod become standard practice.

Generally, the reticle pods used in the semiconductor process are made of anti-contaminate material to keep the reticle clean. The reticle pods or semiconductor component containers also should comply with the miniature cleanroom requirements of Standard Mechanical Interface (SMIF) technology. However, even in a controlled environment, the reticle pods are still subjected to particle contamination resulting from the fluctuation of air pressure or the air disturbance by the movement of the container. It is still possible for the particles/contaminants to be carried into the region between the reticle and the container and even onto the reticle, so the reticle pods still couldn't provide sufficient protection for the reticle from particle contamination.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
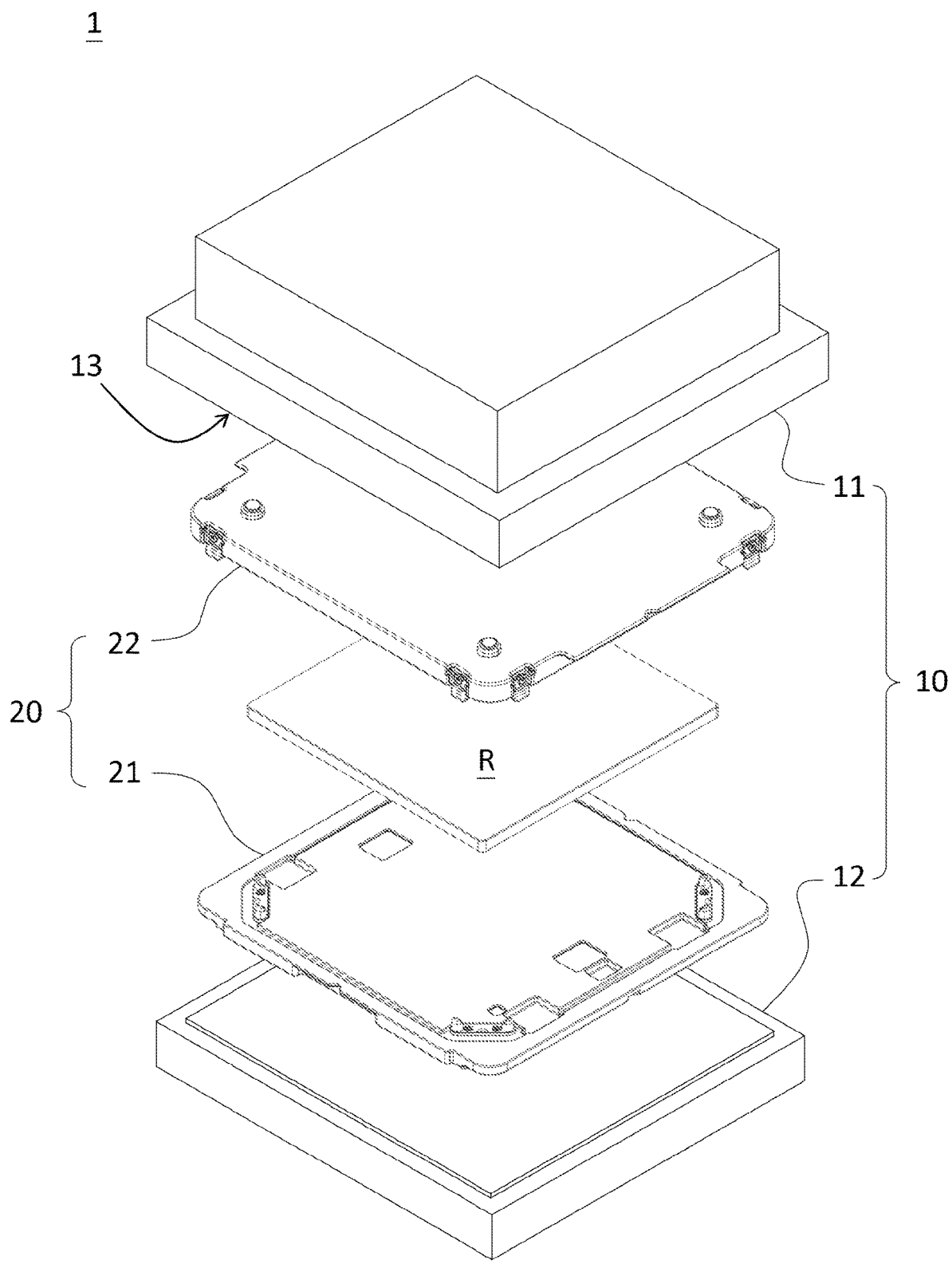
FIG. 1 is an exploded view of an EUV reticle pod according to some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The exemplary EUV reticle pod (e.g., pod system 1) includes a base (e.g., inner base 21) and a cover (e.g., inner lid 22). In some embodiments, at least one trench structure with annular loop pattern is provided on the base for trapping or capturing particles. In some other embodiments, the at least one trench with circular loop structure is provided on the base to trap or capture particles. Therefore, the risk of particles migrating into the region between the carrying surface and the EUV reticle is mitigated. Reference will now be made in detail to elaborate the contents and the features of the embodiments of the present disclosure, examples of which are illustrated in the accompanying drawings. For clearly showing the features of the present disclosure, elements are simplified or omitted in the drawings, and the relative proportions of components are for exemplary purpose only.

Please refer to FIG. 1, which is an exploded view of an EUV reticle pod according to one embodiment of the instant disclosure. The EUV reticle pod 1 is used for housing an EUV reticle R. The EUV reticle pod 1 includes an outer box assembly 10 and an inner box assembly 20. The outer box assembly 10 includes an upper portion 11 and a lower portion 12 that cooperate with each other and define a containing space 13 for receiving the inner box assembly 20.

In the present embodiment, each of the upper portion 11 and the lower portion 12 of the outer box assembly 10 is in a quadrilateral shape including, but not limited to, rectangular shape. When the upper portion 11 and the lower portion 12 are engaged with each other, an air-tight status is formed to separate the containing space 13 from the outside of the outer box assembly 10. The upper portion 11 and the lower portion 12 can be exemplified by having one or more air valves (not shown in the drawings) with filter material such as filter paper disposed at the air valves. The air can be kept clean while entering or leaving the containing space 13 through the air valves. The upper portion 11 can further be exemplified by having several guiding elements (not shown in the drawings). When the upper portion 11 and the lower portion 12 are being attached to each other, the guiding elements may be used to adjust and correct the relative positions of the two portions 11 and 12 or the position of the inner box assembly 20. The lower portion 12 can further be exemplified by having several supporting elements (not shown in the drawings) for supporting the inner box assembly 20. The above-mentioned elements, their structure, and their disposition can be determined by actual product needs, and will be not limited in the present disclosure.

Figure 2:
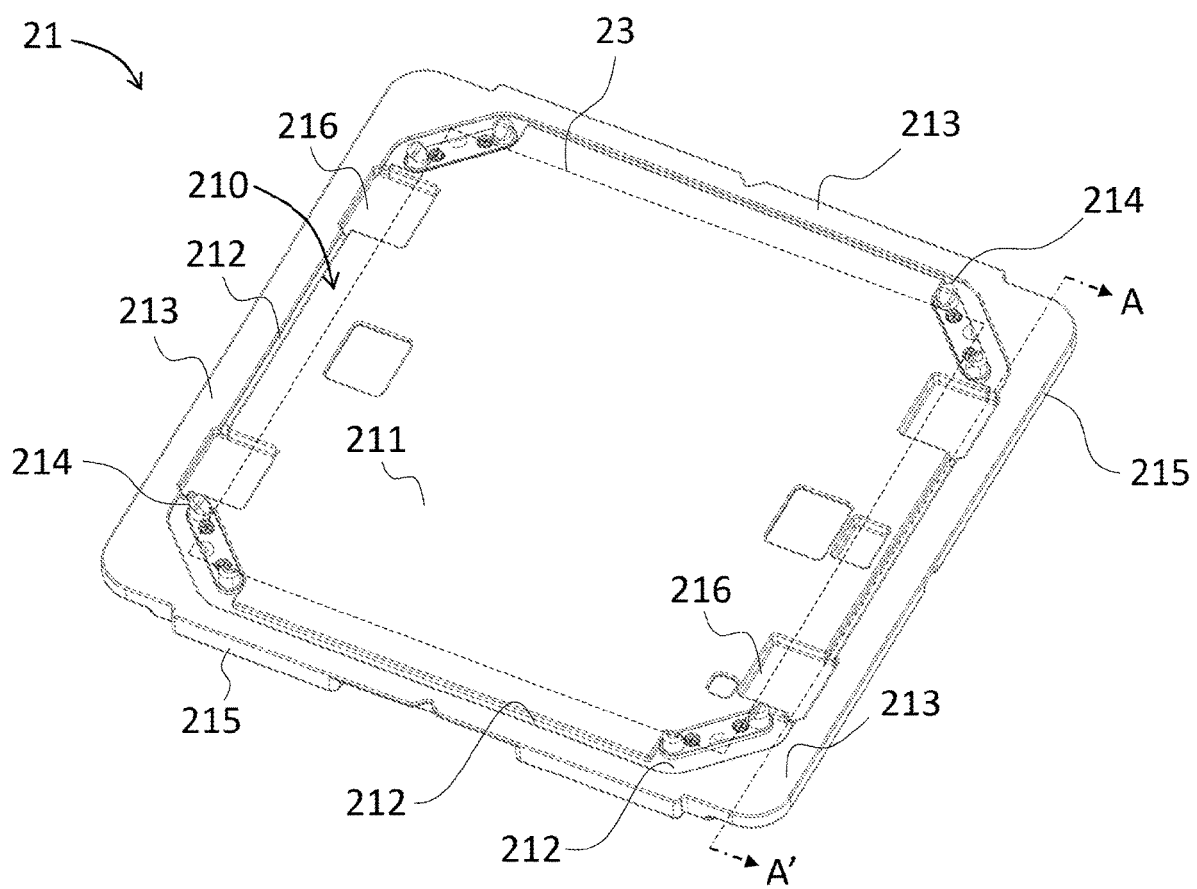
FIG. 2 is a perspective view of the base in FIG. 1 according to some embodiments of the instant disclosure.

Please concurrently refer to FIG. 1 and FIG. 2. FIG. 2 may be a perspective view of the base illustrated in FIG. 1. The inner box assembly 20 of the present embodiment includes a base 21 and a cover 22. The base 21 is provided with an upper surface 210 and a surrounding wall 215. The upper surface 210 is a surface of the base 21 that faces the cover 22, and several positioning members 214 are disposed on and protruded from the upper surface 210. The surrounding wall 215 is the lateral side wall of the base 21 and it connects and surrounds the upper surface 210.

The positioning members 214 and the base 21 are made of different materials. For example, when the base 21 is made of a metallic material, the positioning members 214 are made of a low-particle-generating material such as abrasion resist plastic. In some embodiments, the positioning members 214 can be fixed onto the base 21 by screws and protrude from the upper surface 210. The positioning members 214 can be distributed in correspondence with the four corners of the rectangular EUV reticle R. In some embodiments, each positioning member 214 has an inclined guiding surface for guiding and adjusting the position of the EUV reticle R. Through the configuration of the positioning members 214, a receiving space 23 for the EUV reticle R can be defined over the base 21. The structure, the amount, the fixing mechanism, and the disposition of the positioning members 214 are not limited to the embodiment shown in FIG. 2. Other forms of elements that can define the receiving space 23 on the base 21 may be used here as the positioning members 214.

The upper surface 210 of the base 21 includes a carrying surface 211 (i.e. inner region of the upper surface 210), a trench structure 212, and a first contacting surface 213 (i.e. outer region of the upper surface 210). According to some embodiments, the carrying surface 211, the trench 212, and the first contacting surface 213 are sequentially distributed from a center of the upper surface 210 towards the surrounding wall 215. That is, the carrying surface 211 is in the proximity center of the upper surface 210, the first contacting surface 213 is in the outer region of the upper surface 210, and the trench 212 situates intermediate therebetween. The EUV reticle R is carried over the carrying surface 211 when it is received in the receiving space 23. The trench 212 has an annular loop pattern with a bottom lower than the carrying surface 211. In the present embodiment, the carrying surface 211 is a flat, generally planar surface. The trench 212 continuously and completely surrounds the carrying surface 211, and the first contacting surface 213 continuously and completely surrounds the trench 212. Therefore, one full annular trench 212 is provided on the base 21, as shown in FIG. 2.

Figure 3:
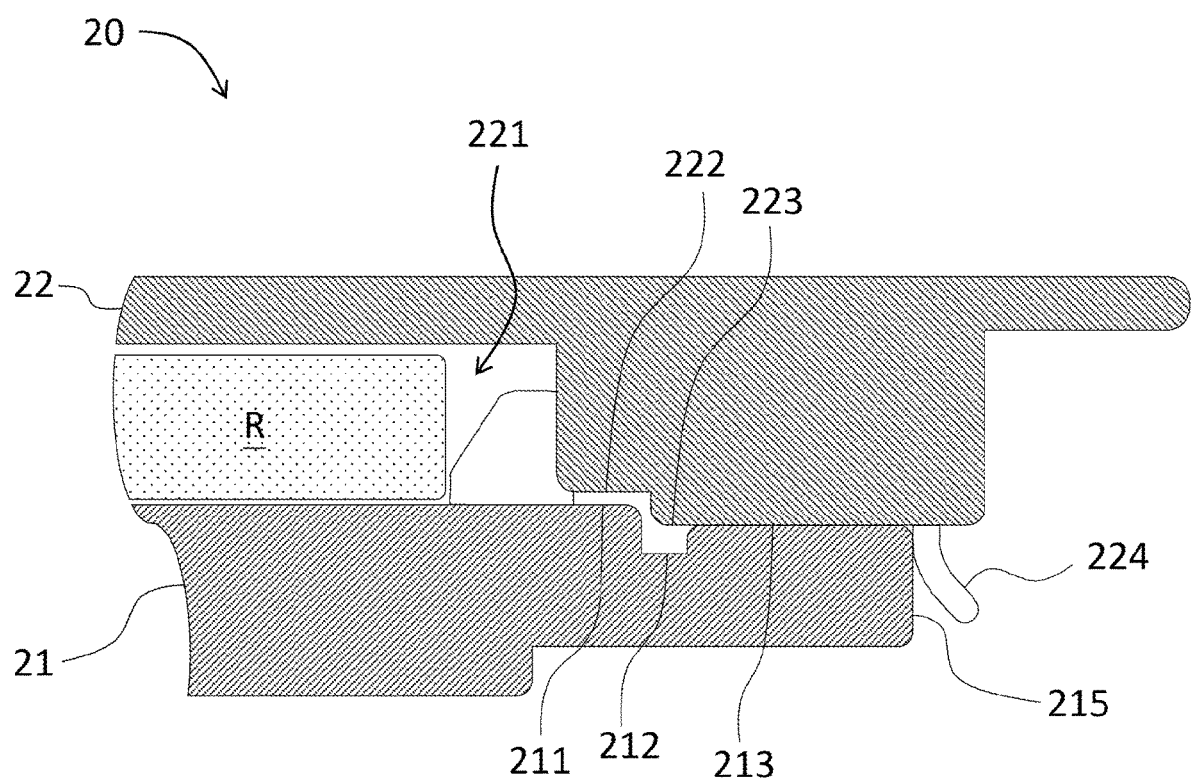
FIG. 3 is a partial cross-sectional view of the inner box assembly and the EUV reticle in FIG. 1 according to some embodiments of the instant disclosure.

Please concurrently refer to FIG. 2 and FIG. 3. FIG. 3 may be a partial cross-sectional view of the inner box assembly and the EUV reticle illustrated in FIG. 1. Only a part of the inner box assembly 20 and received EUV reticle R is shown in FIG. 3. The left side in FIG. 3 is close to the center of the carrying surface 211, and the right side in FIG. 3 shows the edge of inner box assembly 20 (that is where the surrounding wall 215 located). The carrying surface 211, the trench 212, and the first contacting surface 213 are sequentially distributed from the center of the upper surface 210 towards the surrounding wall 215 (from left to right in FIG. 3). The first contacting surface 213 is lower than the carrying surface 211, and the bottom of the trench 212 is lower than the first contacting surface 213. The trench 212 is a recess structure and has a bottom at the lowest location. Measuring from the bottom of the trench 212, the side wall that connects the carrying surface 211 is taller than the side wall that connects the first contacting surface 213. Each side wall is connected to the bottom of the trench 212 through a sharp corner; or at least with a very small, insignificantly curved corner.

The trench 212 is used for trapping or capturing particles. When the particles in the trench 212 are raised by the air flow, they will be blocked by the side wall that connects to the carrying surface 211. The chances of the particles migrating into the region between the EUV reticle R and the carrying surface 211 or even attaching onto the EUV reticle R can be lowered, thus reducing the contamination on the carrying surface 211. The trench 212 has another beneficial aspect. Practically, the air-tight sealing between the first contacting surfaces 213 and the second contacting surface 223 may not achieve a desired level due to process variation issues (such as surface treatment errors). When the desired air-tightness between the two contacting surfaces 213 and 223 is not attained, a small air flow channel is formed therebetween to lead the particles towards the trench 212. Since the two side walls of the trench 212 have different heights, the particles may be trapped and retained in the trench 212 and prevented from migrating into the region between the carrying surface 211 and the EUV reticle R.

Figure 4:
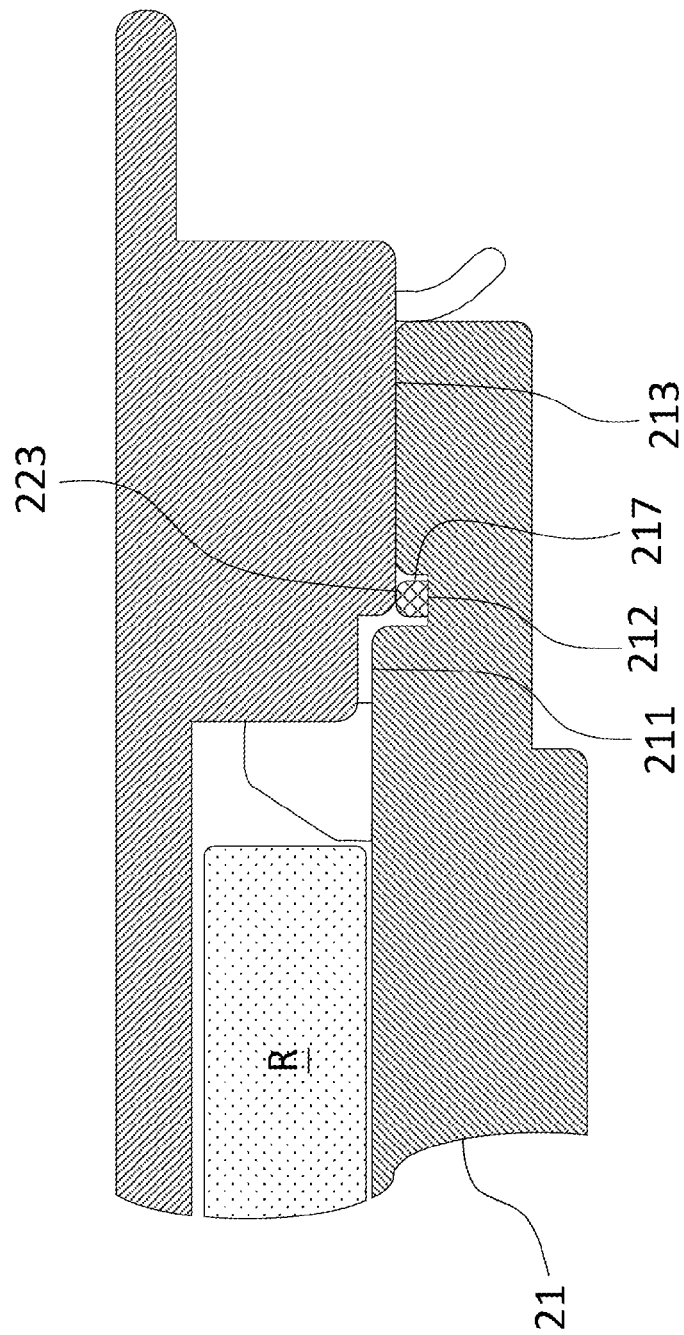
FIG. 4 is the same cross-sectional view as FIG. 3 with a block member on the base according to some embodiments of the instant disclosure.

Please refer to FIG. 4, which may be the same cross-sectional view as shown in FIG. 3. In this embodiment, the base 21 includes an additional blocking member 217 disposed in the trench 212, i.e., on the bottom surface of the trench 212. The height of the blocking member 217 from its bottom to a top end thereof is at least slightly taller than the side wall of the trench 212 that connects to the first contacting surface 213. When the cover 22 is engaged with the base 21, the top end of the blocking member 217 is brought into firm contact with the second contacting surface 223. As a result, particles can be prevented from migrating into the region between the carrying surface 211 and the EUV reticle R. In one embodiment, the blocking member 217 has an annular loop profile configured to be continuously fitted in the trench 212. In some embodiments, the block member 217 has a circular loop structure to be continuously fitted in the trench 212.

Figure 5:
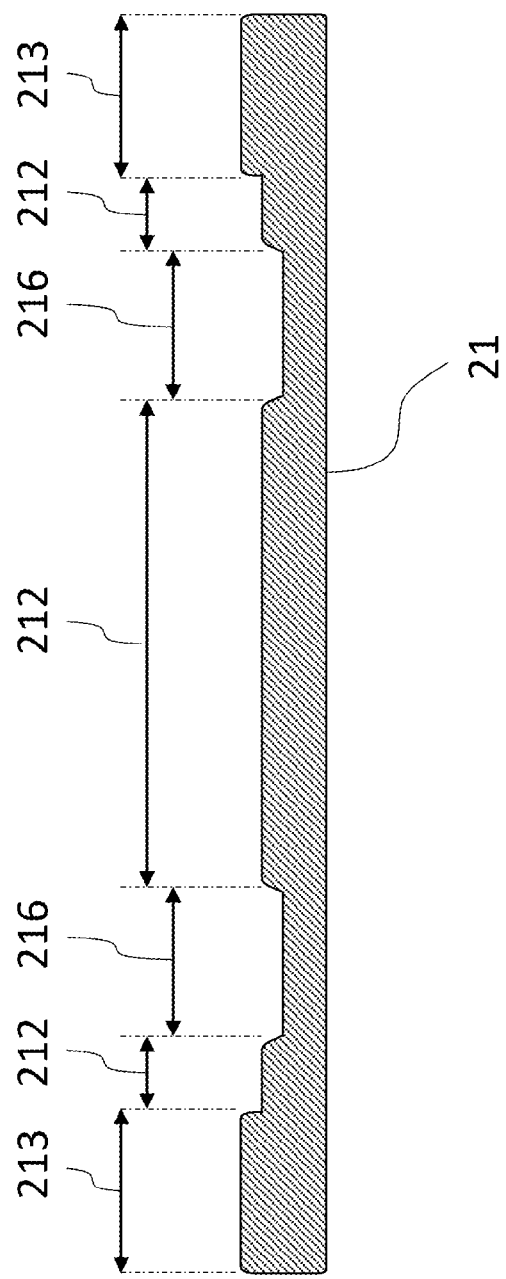
FIG. 5 is a cross-sectional view of the base in FIG. 2 according to some embodiments of the instant disclosure.

Please refer concurrently to FIG. 2 and FIG. 5. FIG. 5 may be a cross-sectional view of the base shown in FIG. 2. The cross-sectional view of the base 21 in FIG. 2 is taken along, e.g., line A-A' shown in FIG. 2. In the present embodiment, the upper surface 210 of the base 21 further includes at least one basin 216 that communicates with the trench 212. In the illustrated embodiment, a bottom of the basin 216 is lower than the bottom of the trench 212, and extents in a direction substantially parallel to the carrying surface 211. A width of the basin 216 is larger than a width of the trench 212. The basin 216 is a further recess structure having larger area to trap or capture particles. Therefore, in addition to the trench 212, the particles can be retained in the basin 216 as well.

Figure 6:
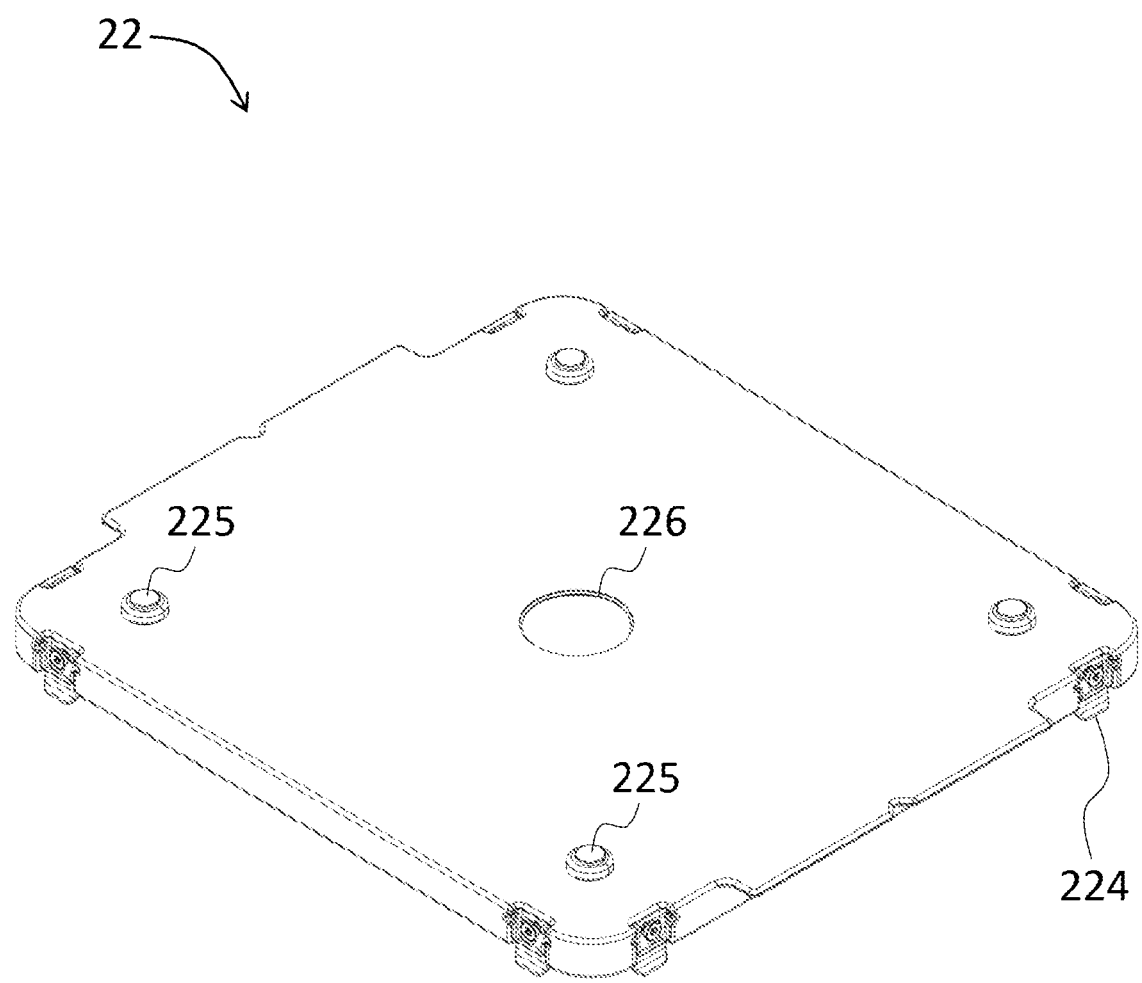
FIG. 6 is a perspective view of the cover in FIG. 1 according to some embodiments of the instant disclosure.
Figure 7:
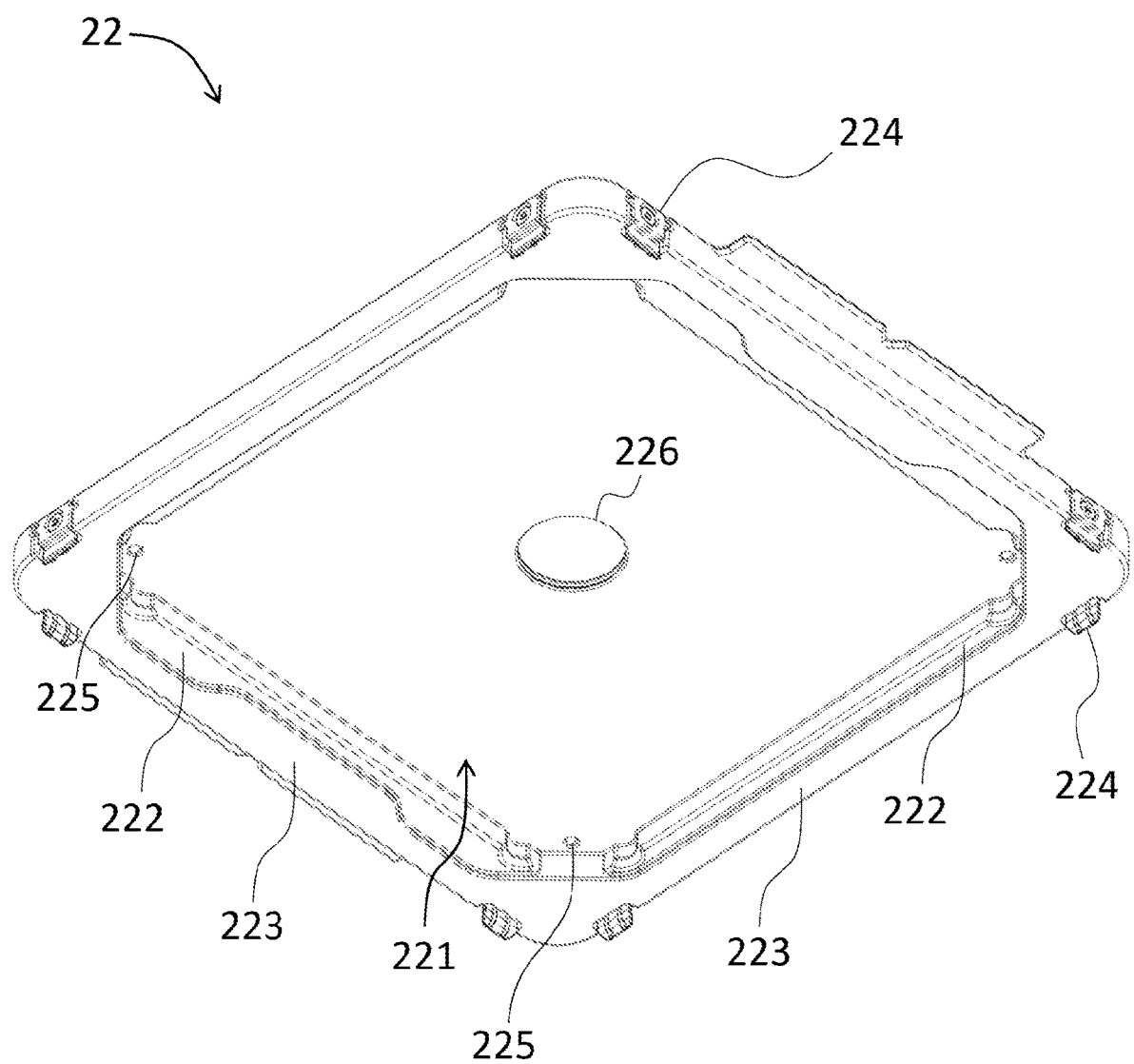
FIG. 7 is another perspective view of the cover in FIG. 1 according to some embodiments of the instant disclosure.

The cover 22 of the inner box assembly 20 will be elaborated in more detail with reference to FIG. 6 and FIG. 7. FIG. 6 is a perspective view of an exemplary cover (e.g., cover 22 as shown in FIG. 1). FIG. 7 is another perspective view of the exemplary cover. The cover 22 is configured to mate with the base 21, and is formed with a concave 221 and a second contacting surface 223. The concave 221 is used for accommodating the EUV reticle R, and the second contacting surface 223 is used for cooperating with the first contacting surface 213 to form an air-tight seal, e.g., as shown in FIG. 3. In the present embodiment, the first and the second contacting surfaces 213 and 223 are flat surfaces or planar surfaces with relative small roughness, and are capable of cooperating with each other to provide sealing when they are brought into contact.

In the present embodiment, the cover 22 includes an indented surface 222 between the concave 221 and the second contacting surface 223. The indented surface 222 is located on a different horizontal level from that of the second contacting surface 223 such that a gap is kept between the indented surface 222 and the upper surface 210 of the base 21. To be more specific, the two horizontal levels on which the indented surface 222 and the second contacting surface 223 respectively situated are two parallel horizontal levels. As shown in FIG. 3, the gap is formed between the indented surface 222 and the carrying surface 211 of the upper surface 210, and the trench 212 is partially covered by the second contacting surface 223. When the cover 22 is engaged with the base 21, the deposited particles or particles raised by air flow can migrate into the trench 212 and the basin 216, thereby being trapped or captured therein.

Please refer to FIG. 6 and FIG. 7. The cover 22 of the present embodiment includes several guiding members 224. The guiding members 224 are configured in a way that they extend towards the base 21 when the cover 22 is engaged with the base 21. The guiding members 224 extending towards the base 21 are configured to elastically contact the surrounding wall 215 of the base 21, e.g., as shown in FIG. 3. While the cover 22 is mated with the base 21, the guiding members 224 are used to adjust and correct the relative positions of the cover 22 and the base 21, so the two can be engaged correctly. In the present embodiment, the guiding members 224 can be configured in a way corresponding to the four corners of the cover 22. However, the amount and the disposition of the guiding members 224 are not limited to the embodiment shown in FIG. 6 and FIG. 7. Other forms of elements, which extend toward the base 21 and elastically contact the surrounding wall 215 upon coupling between the cover 22 and the base 21 may be used here as the guiding members 224.

The cover 22 of the present embodiment includes several elastic members 225 that correspond to the locations of the positioning members 214. The elastic members 225 are configured to contact and press a workpiece (e.g., an EUV reticle R) when the cover 22 is engaged with the base 21 and the inner box assembly 20 is contained in the outer box assembly 10. The elastic members 225 help to restrain the movement of the EUV reticle R in the vertical direction, thereby preventing the EUV reticle R from moving and thus inhibiting the generation of containment/particles from friction between structural components. Practically, several protruded elements (not shown in the drawings) can be disposed on the inner surface of the upper portion 11 of the outer box assembly 10, which may be arranged in correspondence with the locations of the elastic members 225. When the inner box assembly 20 is received in the containing space 13 of the outer box assembly 10, the protruded elements may respectively press on one end of the elastic members 225. The other end of the elastic members 255 are brought into contact and press the EUV reticle R consequently. The structure and the configuration of the protruded elements are not limited in to that shown in the instant exemplary embodiment.

In the present embodiment, the cover 22 includes at least one air inlet 226, and a filtration material may be disposed at the air inlet 226. The air inlet 226 provides a window for the air to entering the concave 221. When air is purged into the concave 221 through the air inlet 226, the particles in the concave 221, now carried by the air flow, migrate towards the trench 212 outside the carrying surface 221, so that the particles can be trapped or captured in the trench 212 or the basin 216.

Figure 8:
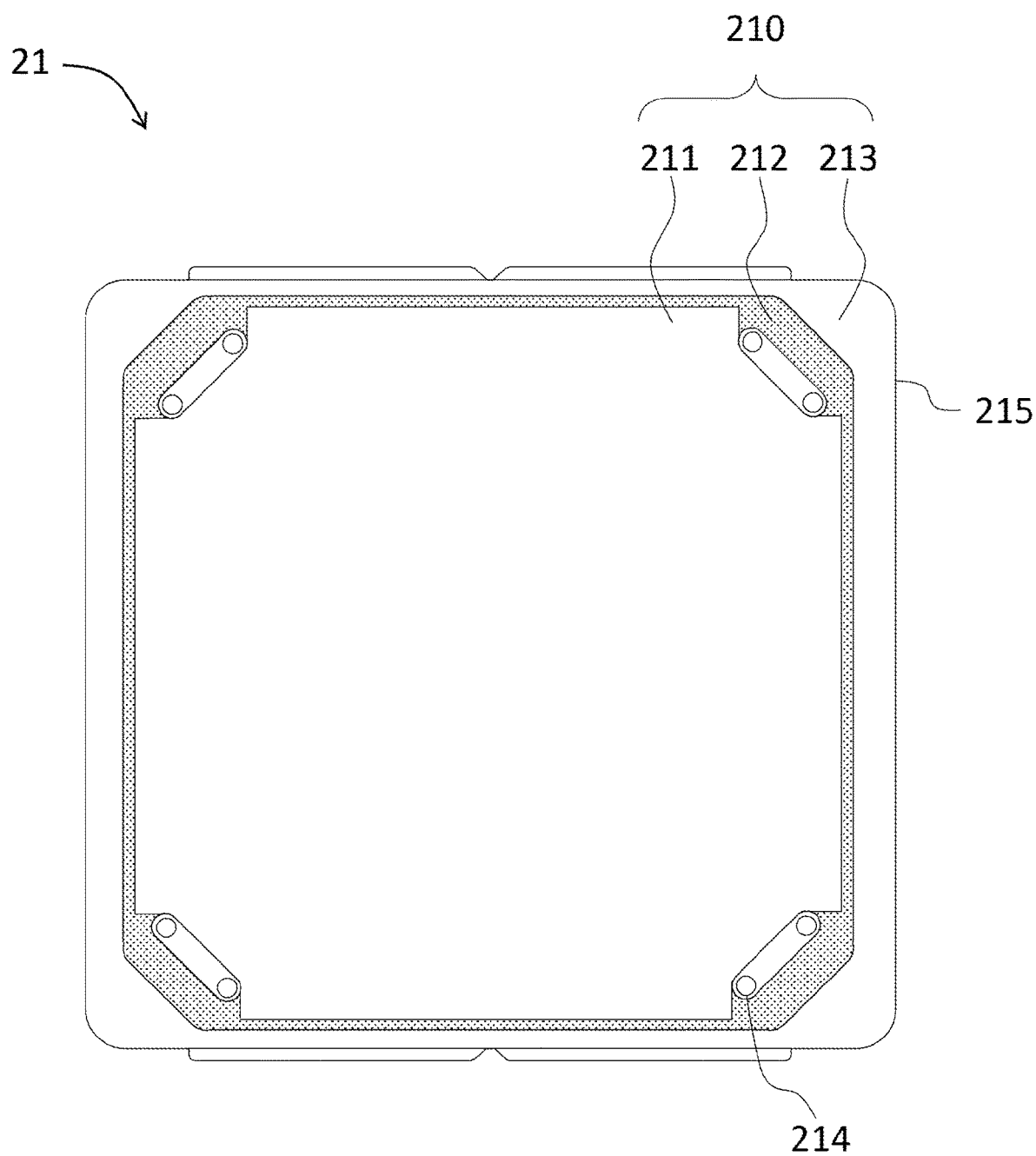
FIG. 8 is a perspective view of the carrying surface, the trench, and the first contacting surface in FIGS. 1-3 according to some embodiments of the instant disclosure.

Please refer to FIG. 8, which is a plane view of the carrying surface, the trench, and the first contacting surface as illustrated in, e.g., FIGS. 1-3. As previously depicted, the carrying surface 211, the trench 212, and the first contacting surface 213 of the upper surface 210 are distributed sequentially from the center of the upper surface 210 toward the surrounding wall 215. In the illustrated embodiment, the trench 212 completely and continuously surrounds the carrying surface 211, and the first contacting surface 213 completely and continuously surrounds the trench 212. Accordingly, a full annular trench 212 is provided on the base 21. However, the disclosure is not limited to the specific illustration provided herein. For instance, in some embodiments, a less than fully enclosing trench pattern may be utilized, e.g., to accommodate additional device features on the base 21.

Figure 9:
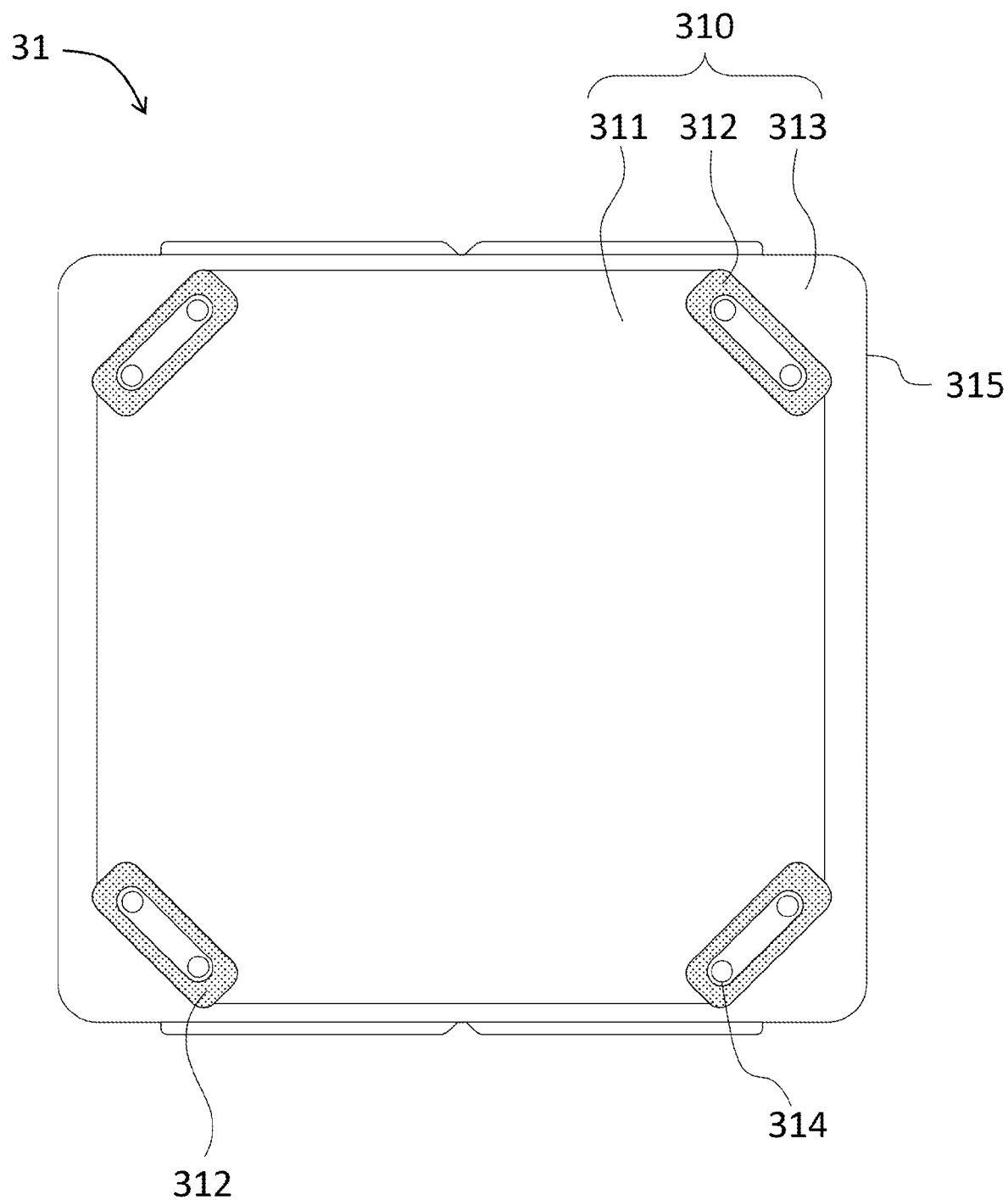
FIG. 9 is a perspective view of the carrying surface, the trench, and the first contacting surface according to some embodiments of the instant disclosure.

Please refer to FIG. 9, which is a plane view of the carrying surface, the trench, and the first contacting surface according to some embodiments of the instant disclosure. Of a base 31 of an EUV reticle pod as shown in FIG. 9, a carrying surface 311, several trenches structures 312, and a first contacting surface 313 of an upper surface 310 are distributed sequentially from a center of the carrying surface 311 towards a surrounding wall 314. The trenches 312 are provided on the upper surface 310, each having a planar profile of an annular loop. In some embodiments, the annular loop structure may include a circular loop structure. The trenches 312 is arranged between the carrying surface 311 and the first contacting surface 313, and each of which respectively surrounds the positioning members 314 position proximate a corner of the base 31. A bottom of each trench 312 is lower than the first contacting surface 313 and the carrying surface 311. Thus, each trench 312 comprises a recess structure. Each annular loop pattern of the trench 312 that surrounds the positioning members 314 may be used to capture or trap particles generated at the corresponding location. The particles in the trench 312, when being raised by air flow, can be blocked by the side walls of the trench 312. The migration of particles onto the carrying surface 311 may thus be mitigated, and particle contamination on the EUV reticle R may be reduced.

According to the above-mentioned embodiments, an EUV reticle pod includes an outer box assembly and an inner box assembly. The outer box assembly includes an upper portion and a lower portion that cooperate with each other and define a containing space for the inner box assembly. The inner box assembly includes a base and a cover. The base has an upper surface and surrounding wall. Several positioning members are disposed on and protruded from the upper surface to define a receiving space for an EUV reticle. The surrounding wall connects and surrounds the upper surface. The upper surface includes a carrying surface, at least one trench, and a first contacting surface. The EUV reticle is carried above the carrying surface when it is received in the receiving space. In some embodiments, the trench has an annular loop structure and a bottom of the trench is lower than the carrying surface. In some other embodiments, the trench has a circular loop structure and a bottom of the trench is lower than the carrying surface. The carrying surface, the trench, and the first contacting surface are sequentially distributed from a center of the upper surface towards the surrounding wall. The cover is used for mating with the base and has a concave for the EUV reticle and a second contacting surface for cooperating with the first contacting surface to form an air-tight seal. By trapping or capturing the particles in the annular-loop-structured trench, the problems of particle contamination can be mitigated.

Figure 10:
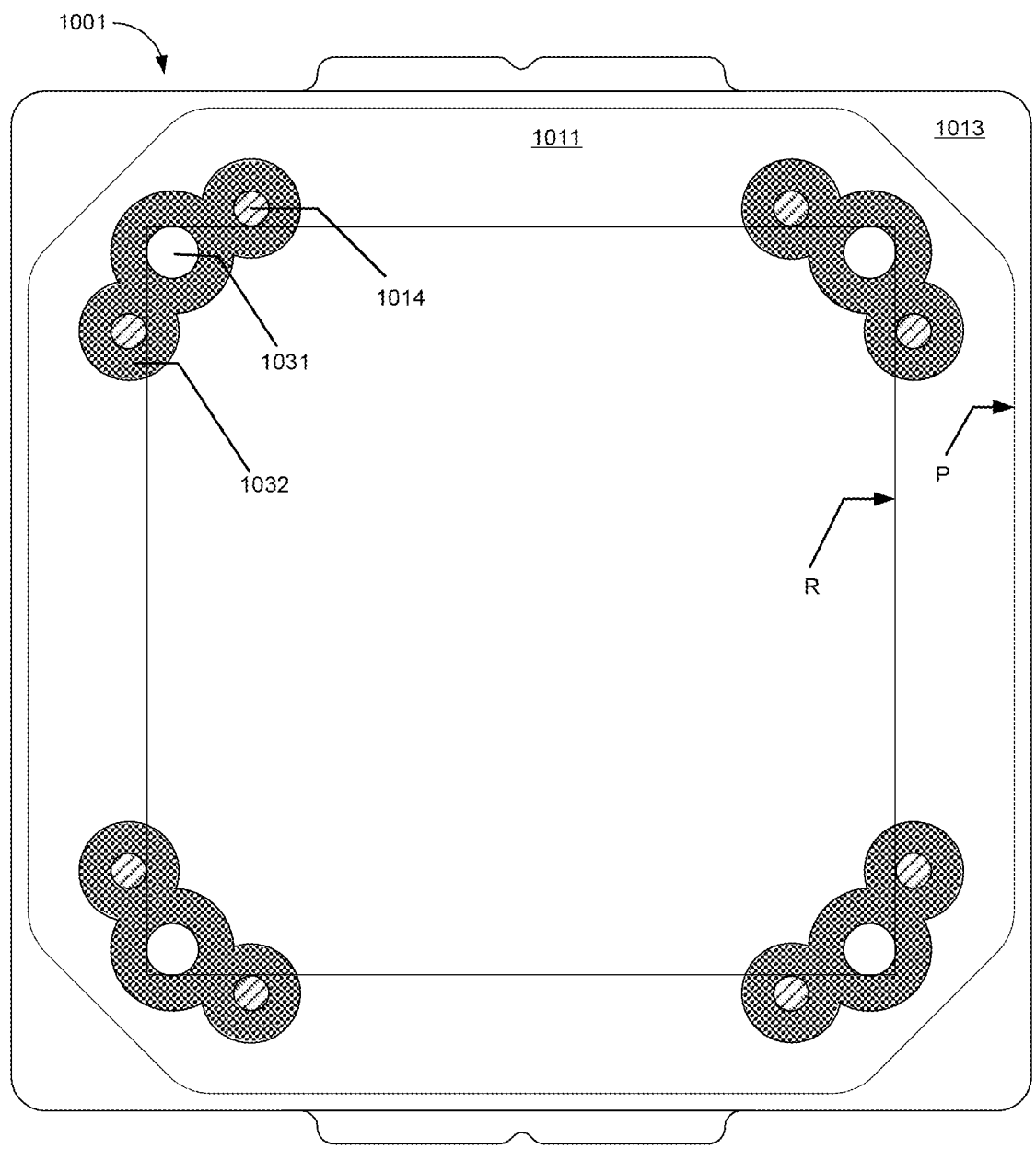
FIG. 10 is a perspective view of the base according to some embodiments of the instant disclosure.

FIG. 10 is a plane view of a base 1001 according to some embodiments of the instant disclosure. The base 1001 includes an upper surface and a bottom surface opposite the upper surface. The upper surface of the base 1001 may include an inner region 1011 and an outer region 1013. In some embodiments, the inner region 1011 is substantially planar to the outer region 1013. The line P in FIG. 10 is used to show a division between the inner region 1011 and the outer region 1013.

The base 1001 is provided with a plurality of positioning structures. The plurality of positioning structures may be disposed within the inner region 1011. Each positioning structure includes a pair of positioning members 1014, a support member 1031 disposed between the pair of positioning members 1014, and a guide trench structure 1032 surrounding the pair of positioning members 1014 and the support member 1031.

The pair of positioning members 1014 may be used to position a corner of a workpiece R (e.g., a reticle) placed in the reticle pod. The pair of positioning members 1014 respectively protrudes from the surface of the inner region 1011. In some embodiments, the support member 1031 may have a height (from the bottom surface of the base) less than the height of the positioning members 1014 (from the bottom surface of the base). In some embodiments, the support member 1031 may be substantially coplanar with the inner region 1011. In some embodiments, the support member 1031 may have a height greater than the inner region 1011. However, the protrusion of the support member 1031 from the inner region 1011 does not impede the stability of the workpiece R within the base 1001.

A wall of the guide trench structure 1032 has rounded contour for a planar profile, which surrounds the pair of positioning members 1014 and the support member 1031. The guide trench structure 1032 further has a bottom surrounded by the wall. In some embodiments, the portion of the wall of the guide trench structure 1032 closest to the inner region 1011 has a rounded planar profile configured to guide the direction of intruding particles (e.g., vacuumed into the base) right back out of the base. In some embodiments, the wall(s) of guide trench structure 1032 may be formed by a combination of a plurality of arc shaped sections continuously coupled to each other. The bottom of the guide trench structure 1032 may have a height from the bottom surface of the base less than the height of the inner region 1011 from the bottom surface of the base. In some embodiments, the outer region of a cover (e.g., cover 22 shown in FIG. 1) may be in physical contact with the outer region 1013 of the base 1001 when the cover is disposed over the base.

Figure 11:
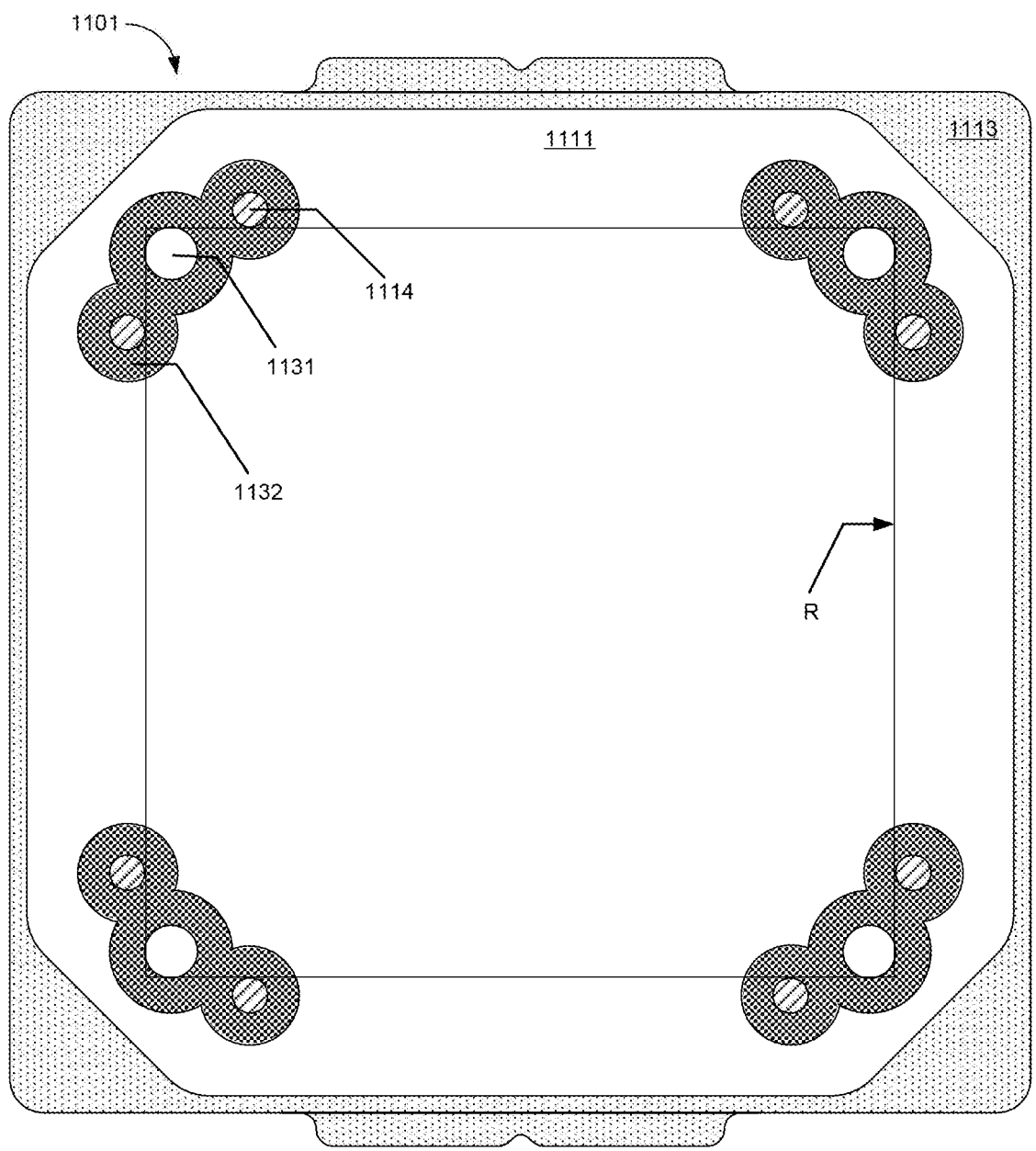
FIG. 11 is a perspective view of the base according to some embodiments of the instant disclosure.

FIG. 11 is a plane view of the base 1101 according to some embodiments of the instant disclosure. The base 1101 includes an upper surface and a bottom surface opposite the upper surface. The upper surface of the base 1101 may include an inner region 1111 and an outer region 1113. In some embodiments, the inner region 1111 is higher than the outer region 1113. The base 1101 includes a plurality of positioning structures. The plurality of positioning structures may be disposed within the inner region 1111. Each positioning structure includes a pair of positioning members 1114, a support member 1131 disposed between the pair of positioning members 1114, and a guide trench structure 1132 surrounding the pair of positioning members 1114 and the support member 1131.

The pair of positioning members 1114 may be used to position a corner of a workpiece R placed in the reticle pod. The pair of positioning members 1114 are protruding from the surface of the inner region 1111. In some embodiments, the support member 1131 may have a height from the bottom surface of the base less than the height of the positioning members 1114 from the bottom surface of the base. In some embodiments, the support member 1131 may be substantially planar to the inner region 1111. In some embodiments, the support member 1131 may have a height greater than the inner region 1111. However, the protrusion of the support member 1131 from the inner region 1111 does not impede the stability of the reticle R within the base 1101.

The guide trench structure 1132 concurrently surrounding the pair of positioning members 1114 and the support member 1131 has wall with rounded contour. The guide trench structure 1132 further has a bottom surrounded by the wall. In some embodiments, the portion of the wall of the guide trench structure 1132 closest to the inner region 1111 has a rounded planar profile to guide the direction of particles vacuumed into the base 1101 right back out of the base 1101. The bottom of the guide trench structure 1132 may have a height from the bottom surface of the base less than the height of the inner region 1111 from the bottom surface of the base. The bottom of the guide trench structure 1132 may have a height from the bottom surface of the base less than the height of the outer region 1113 from the bottom surface of the base. In some embodiments, the outer region of a cover (e.g., cover 21 as previously illustrated) may be in physical contact with the outer region 1113 of the base 1101 when the cover is disposed over the base.

Figure 12:
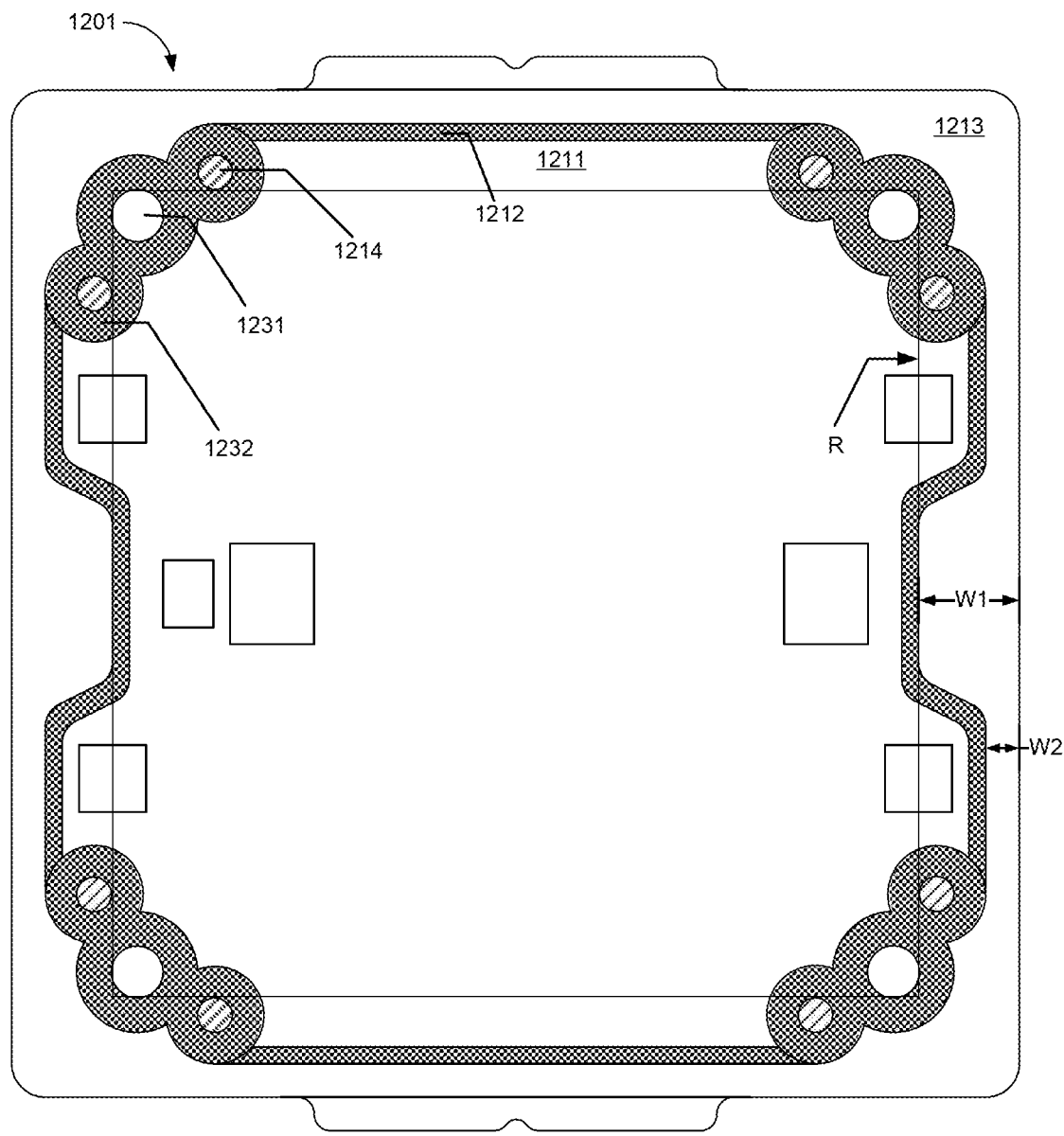
FIG. 12 is a perspective view of the base according to some embodiments of the instant disclosure.

FIG. 12 is a perspective view of the base 1201 according to some embodiments of the instant disclosure. The base 1201 includes an upper surface and a bottom surface opposite the upper surface. The upper surface of the base 1201 may include an inner region 1211 and an outer region 1213. In some embodiments, the inner region 1211 is substantially planar to the outer region 1213. In some other embodiments, the inner region 1211 is higher than the outer region 1213.

The base 1201 includes a plurality of positioning structures. The plurality of positioning structures may be disposed between the outer region 1213 and the inner region 1211. Each positioning structure includes a pair of positioning members 1214, a support member 1231 disposed between the pair of positioning members 1214, and a guide trench structure 1232 surrounding the pair of positioning members 1214 and the support member 1231. The pair of positioning members 1214 may be used to position a corner of a reticle R placed in the reticle pod. The pair of positioning members 1214 respectively protrudes from the surface of the inner region 1211.

In some embodiments, the support member 1231 may have a height from the bottom surface of the base less than the height of the positioning members 1214 from the bottom surface of the base. In some embodiments, the support member 1231 may be substantially planar to the inner region 1211. In some embodiments, the support member 1231 may have a height greater than the inner region 1211. However, the protrusion of the support member 1231 from the inner region 1211 does not impede the stability of the reticle R within the base 1201.

A wall of the guide trench structure 1232, which concurrently surround the pair of positioning members 1214 and the support member 1231, has rounded contour for planar profile. The guide trench structure 1232 further has a bottom surrounded by the wall. In some embodiments, the portion of the wall of the guide trench structure 1232 closest to the inner region 1211 has a rounded planar profile configured to guide the direction of intruding particles (e.g., vacuumed into the base) right back out of the base. The bottom of the guide trench structure 1232 may have a height from the bottom surface of the base less than the height of the inner region 1211 from the bottom surface of the base.

In some embodiments, the base 1201 further includes a peripheral trench structure 1212 disposed between the inner region 1211 and the outer region 1213. In some embodiments, the peripheral trench structure 1212 has an enclosed planar loop profile. In some embodiments, the positioning structures are formed along the peripheral trench structure 1212. In some embodiments, the peripheral trench structure 1212 intersects the guide trench structure 1232. In some embodiments, the peripheral trench structure 1212 is adjoined to the guide trench structure 1232. The peripheral trench structure 1212 in FIG. 12 shows a boundary division between the inner region 1211 and the outer region 1213. In some embodiments, the width W1 of a section of the outer region 1213 is greater than the width W2 of another section of the outer region 1213. By way of example, due to the planar shape of the peripheral trench structure 1212, there may be different width for the outer region 1213 at different portions. In some embodiments, portions of the peripheral trench structure 1212 is indented towards the center of the base 1201. In some embodiments, the outer region of a cover may be in physical contact with the outer region 1213 of the base 1201 when the cover is disposed over the base.

Figure 13:
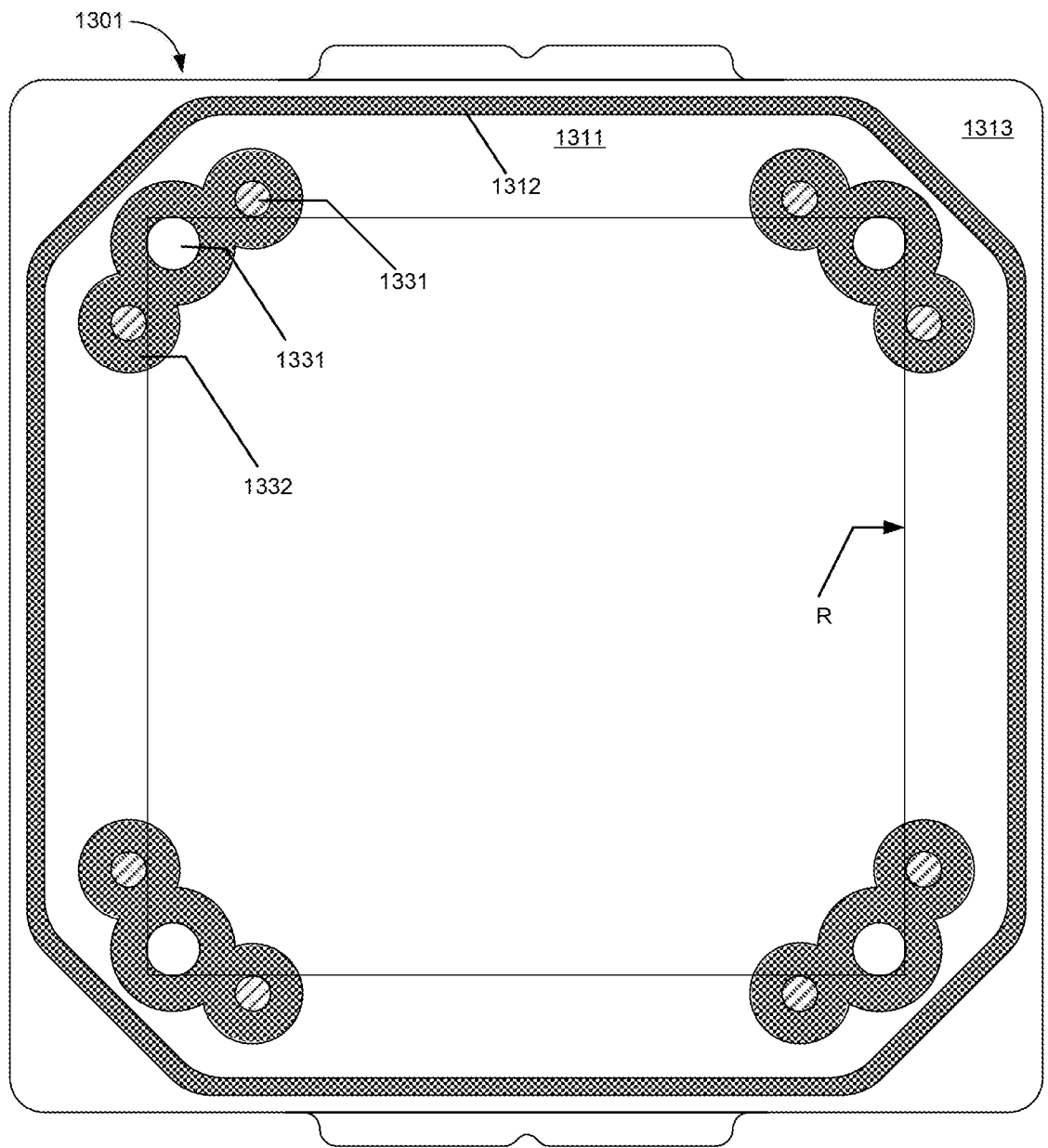
FIG. 13 is a perspective view of the base according to some embodiments of the instant disclosure.

FIG. 13 is a plane view of the base 1301 according to some embodiments of the instant disclosure. The base 1301 includes an upper surface and a bottom surface opposite the upper surface. The upper surface of the base 1301 may include an inner region 1311 and an outer region 1313. In some embodiments, the inner region 1311 is substantially planar to the outer region 1313. In some other embodiments, the inner region 1311 is higher than the outer region 1313.

The base 1301 includes a plurality of positioning structures. The plurality of positioning structures may be disposed within the inner region 1311. Each positioning structure includes a pair of positioning members 1314, a support member 1331 disposed between the pair of positioning members 1314, and a guide trench structure 1332 surrounding the pair of positioning members 1314 and the support member 1331. The pair of positioning members 1314 may be used to position a corner of a workpiece R placed in the reticle pod. The pair of positioning members 1314 respectively protrudes from the surface of the inner region 1311.

In some embodiments, the support member 1331 may have a height from the bottom surface of the base less than the height of the positioning members 1314 from the bottom surface of the base. In some embodiments, the support member 1331 may be substantially planar to the inner region 1311. In some embodiments, the support member 1331 may have a height greater than the inner region 1311. However, the protrusion of the support member 1331 from the inner region 1311 may not impede the stability of the workpiece R within the base 1301.

The guide trench structure 1332 surrounding the pair of positioning members 1314 and the support member 1331 has wall(s) with rounded planar contour. The guide trench structure 1332 further has a bottom surrounded by the wall. In some embodiments, the portion of the wall of the guide trench structure 1332 closest to the inner region 1311 is rounded to guide the direction of particles vacuumed into the base right back out of the base. The bottom of the guide trench structure 1332 may have a height from the bottom surface of the base less than the height of the inner region 1311 from the bottom surface of the base.

In some embodiments, the base 1301 further includes a peripheral trench structure 1312 disposed between the inner region 1311 and the outer region 1313. In some embodiments, the peripheral trench structure 1312 has an enclosed planar loop profile. The peripheral trench structure 1312 in FIG. 13 serves as a structural division between the inner region 1311 and the outer region 1313. Furthermore, the guide trench structure 1332 may be arranged at a distance from the peripheral trench structure 1312. In some embodiments, the outer region of a cover may be in physical contact with the outer region 1313 of the base 1301 when the cover is disposed over the base.

Figure 14A:
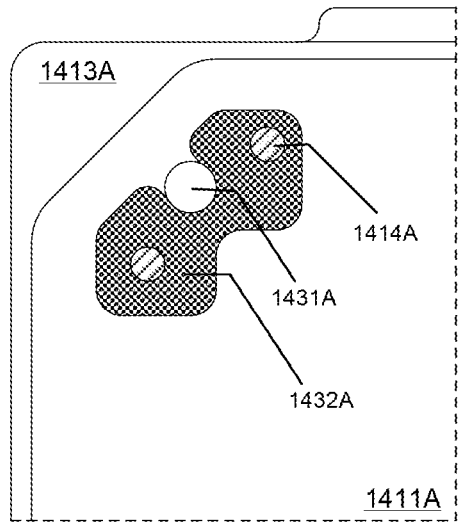
FIGS. 14A-14D are perspective views of the base according to some embodiments of the instant disclosure.
Figure 14B:
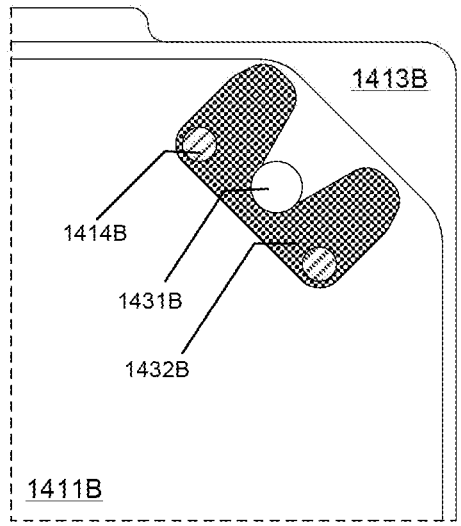
Figure 14C:
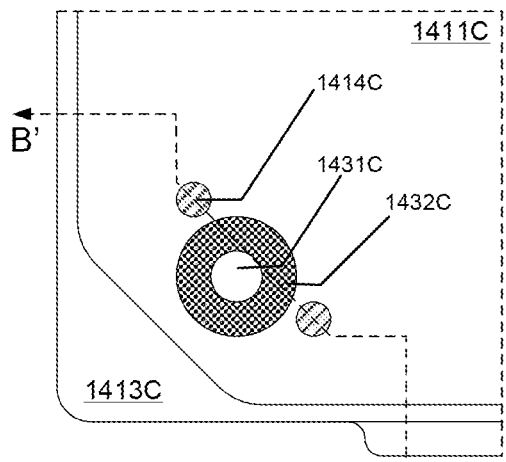
Figure 14D:
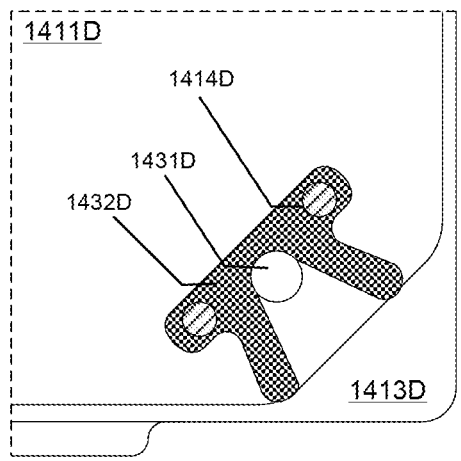

FIGS. 14A-14D are plane views of the base according to some embodiments of the instant disclosure. In the same way as embodiment in FIG. 10, the illustrations in FIGS. 14A, 14B, and 14D discloses a positioning structure disposed within the inner region 1411A, 1411B, 1411D. Each positioning structure includes a pair of positioning members (e.g., 1414A, 1414B, and 1414D), a support member (e.g., 1431A, 1431B, and 1431D) disposed between the pair of positioning members 1414A, 1414B, and 1414D, and a guide trench structure (e.g., 1432A, 1432B, and 1432D) surrounding the pair of positioning members and the support member. Particularly, embodiments illustrated in FIGS. 14A, 14B, and 14D provide exemplary planar layouts for the guide trench structures 1432A, 1432B, and 1432D.

For example, in FIG. 14A, the guide trench structure 1432A has a substantially W-shaped structure.

For another example, in FIG. 14B, the guide trench structure 1432B has a substantially U-shaped structure.

In FIG. 14D, the guide trench structure has a substantially V-shaped structure 1432D. The support member 1431A, 1431B, and 1431D and a portion of the inner region 1411A, 1411B, 1411D form a barrier that prevents particles from continuously circulating within the guide trench structure 1432A, 1432B, and 1432D.

Figure 15A:
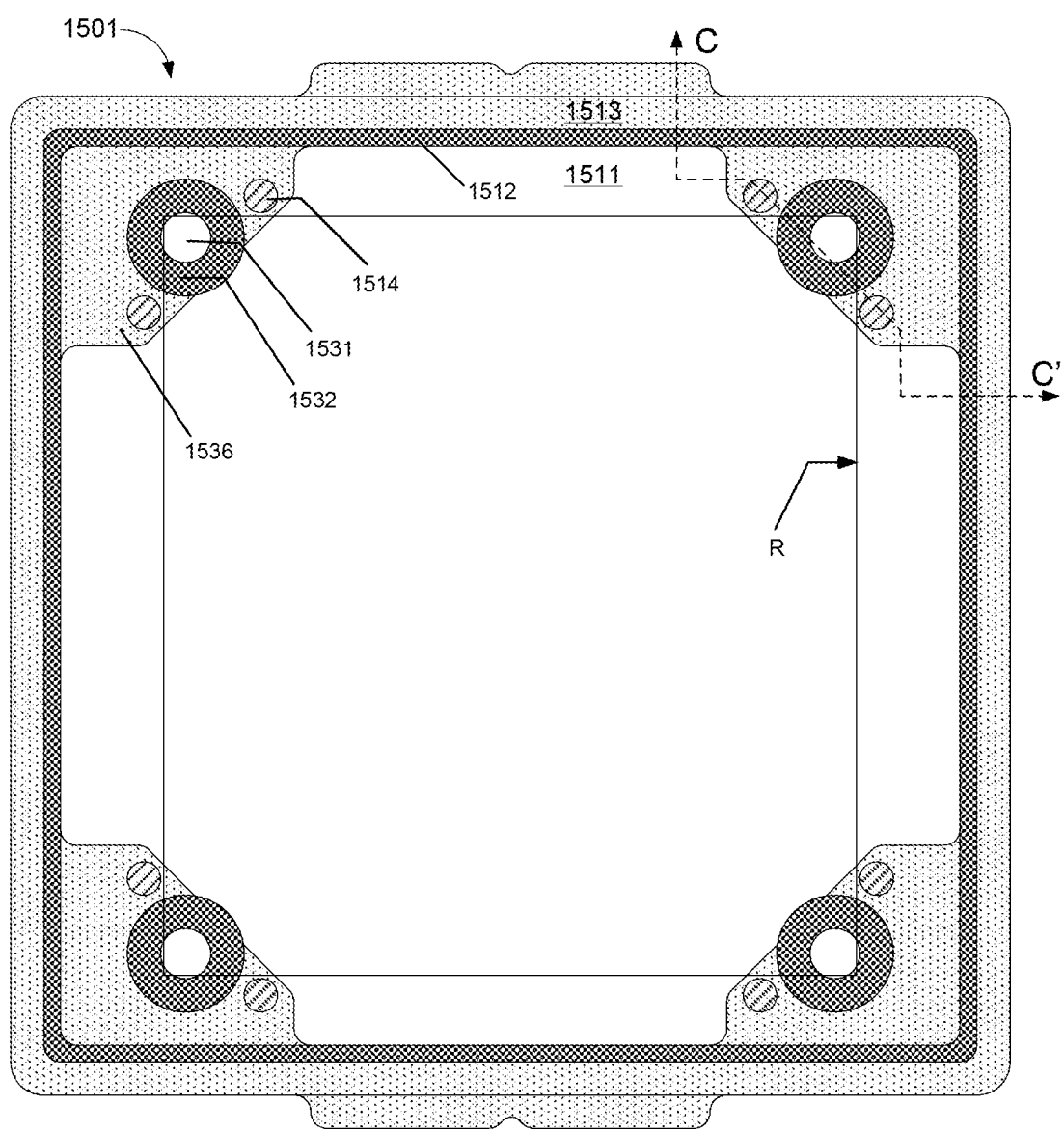
FIG. 15A is a perspective view of the base according to some embodiments of the instant disclosure.

In the embodiments shown in FIGS. 14A, 14B, and 14D, the positioning members 1414A, 1414B, and 1414D may be disposed in a buffer region (e.g., buffer rim 1536 depicted in FIGS. 15A/B). In some embodiments, the buffer rim is disposed within the inner region 1411A, 1411B, 1411D. In some embodiments, a height of the buffer rim (i.e., distance between a rim surface and a bottom surface of the base) may be less than a height of the inner region 1411A, 1411B, 1411D. In some embodiments, the height of the buffer rim may be greater than a height of the bottom surface of the guide trench structure 1432A, 1432B, and 1432D.

On the other hand, FIG. 14C shows a positioning structure disposed within the inner region 1411C. The positioning structure includes a pair of positioning members 1414C, a support member 1431C disposed between the pair of positioning members 1414C, and a guide trench structure 1432C surrounding only the support member 1431C. The root of the pair of positioning members 1414C is disposed on the upper surface of the base. In some embodiments, the guide trench structure 1432C has a circular planar shape. In some other embodiments, a portion of the wall of the guide trench structure 1432C nearest the center of the inner region is rounded in shape to guide the particles away from the workpiece.

Figure 14E:
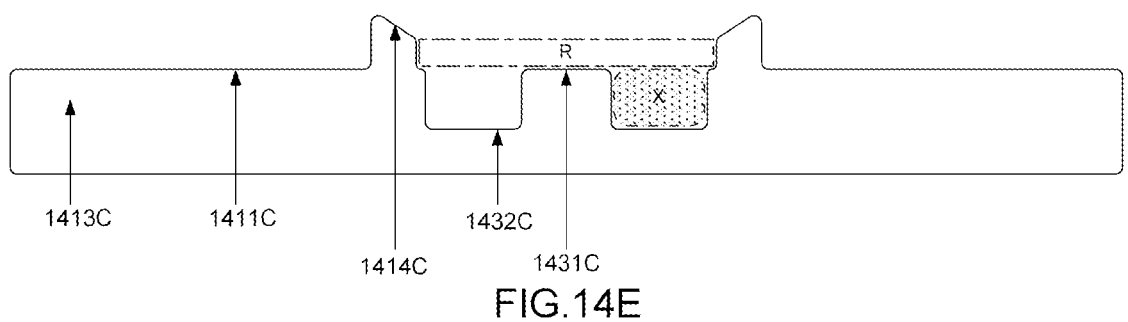
FIG. 14E is a cross-sectional view of the base along B-B' according to some embodiments of the instant disclosure.

FIG. 14E shows a cross-sectional view of the base along C-C' according to some embodiments of the instant disclosure. In some embodiments, the positioning members 1414C have head profiles that decline inward toward the position of the reticle R to enable guiding of the reticle R during placement.

In the illustrated embodiment, the guide trench structure 1432C between the support member 1431C and the positioning member 1414C substantially defines a gas channel area X. In some embodiments, the guide trench structure 1432C is configured with a sectional area X of no less than a predetermined threshold. For example, in some embodiments, the sectional area below the support member 1431C (e.g., below a top surface at the center region of the support member 1431C) and between one of the positioning member 1414C (e.g., as substantially indicated by the shaded region X under a received workpiece R) is configured to meet a sufficient clearance threshold. For one thing, a sufficiently large cross-sectional trench gap between the protruding members (and under a received workpiece R) may facilitate the induction of gas flow around the support member 1431C and promote the generation of vortex at the corner region, thereby enhancing particle trapping during operation of the pod system. In some embodiments, the sectional area X between the support member 1531 and one of the positioning member 1514 is no less than 25 mm^2.

Figure 14F:
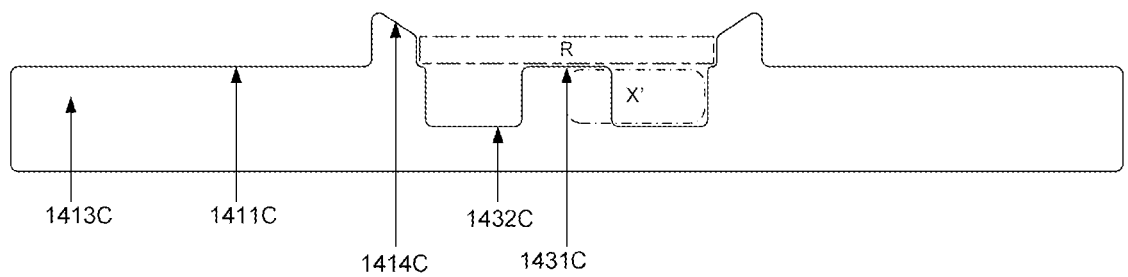
FIG. 14F is a cross-sectional view of the base along B-B' according to some embodiments of the instant disclosure.

Referring to FIG. 14F, in some embodiments, a trench clearance area around the support member (e.g., member 1431C) may be determined with respect to a center axis thereof. For instance, a design reference for the guide trench area (e.g., area X') may be determined from one side of a central axis of the support member 1431C. In some embodiments, the area X' from a cross-sectional center line of the support member 1431C is not less than 25 mm$^2$. The height, width, and separation pitch of each of the protruding members (e.g., member 1431C, 1414C) may be tuned in accordance the design rule to achieve sufficient gas channel dimension, thus ensure effective gas flow induction and particle gathering capability.

FIG. 15A is a plane view of the base 1501 according to some embodiments of the instant disclosure. The base includes an upper surface and a bottom surface opposite the upper surface. The upper surface of the base 1501 may include an inner region 1511 and an outer region 1513. In some embodiments, the inner region 1511 is substantially planar to the outer region 1513. In some other embodiments, the inner region 1511 is higher than the outer region 1513.

The base 1501 includes a plurality of positioning structures. Each positioning structure includes a pair of positioning members 1514, a support member 1531 disposed between the pair of positioning members 1514, and a guide trench structure 1532 surrounding the support member 1531. The pair of positioning members 1514 may be used to position a corner of a workpiece R placed in the reticle pod. The pair of positioning members 1514 are protruding from the upper surface of the base 1501.

In some embodiments, the positioning structure further includes a buffer rim 1536 formed around the guide trench structure 1532. In some embodiments, the buffer rim 1536 of the positioning structure may be lower than the inner region 1511. In some embodiments, the pair of positioning members 1514 is protruding from the buffer rim 1536. In some embodiments, the buffer rim 1536 of the positioning structure may be substantially coplanar with respect to the outer region 1513.

In some embodiments, the support member 1531 may have a height from the bottom surface of the base less than the height of the positioning members 1514 from the bottom surface of the base. In some embodiments, the support member 1531 may be substantially planar to the inner region

1511. In some embodiments, the support member 1531 may have a height greater than the inner region 1511. However, the protrusion of the support member 1531 from the inner region 1511 does not impede the stability of the workpiece R within the base 1501.

The guide trench structure 1532 surrounding the pair of positioning members 1514 and the support member 1531 has wall(s) that has rounded planar contour. The guide trench structure 1532 further has a bottom surrounded by the wall. In some embodiments, the portion of the wall of the guide trench structure 1532 closest to the inner region 1511 is rounded to guide the direction of particles vacuumed into the base right back out of the base. The bottom of the guide trench structure 1532 may have a height from the bottom surface of the base less than the height of the inner region 1511 from the bottom surface of the base.

In some embodiments, the base 1501 further includes a peripheral trench structure 1512 disposed between the inner region 1511 and the outer region 1513. In some embodiments, the peripheral trench structure 1512 has an enclosed planar loop profile. The peripheral trench structure 1512 in FIG. 15A shows a division between the inner region 1511 and the outer region 1513. In some embodiments, the plurality of positioning structures may be disposed between the inner region 1511 and the peripheral trench structure 1512. Furthermore, the guide trench structure 1532 may be arranged at a distance from the peripheral trench structure 1512. In some embodiments, the outer region of a cover may be configured to establish physical contact with the outer region 1513 when the cover is disposed over the base.

In some embodiments, the planar shape of the peripheral trench structure 1512 may be similar to the planar shape of the base 1501. In an exemplary embodiment, the planar shape of the base 1501 may be a quadrilateral shape such as a square or a rectangle. Thus, the planar shape of the planar shape of the peripheral trench structure 1512 may be a quadrilateral shape such as a square or a rectangle. In some other embodiments, the planar shape of the peripheral trench structure 1512 may be contoured to the planar shape of the base 1501.

Figure 15B:
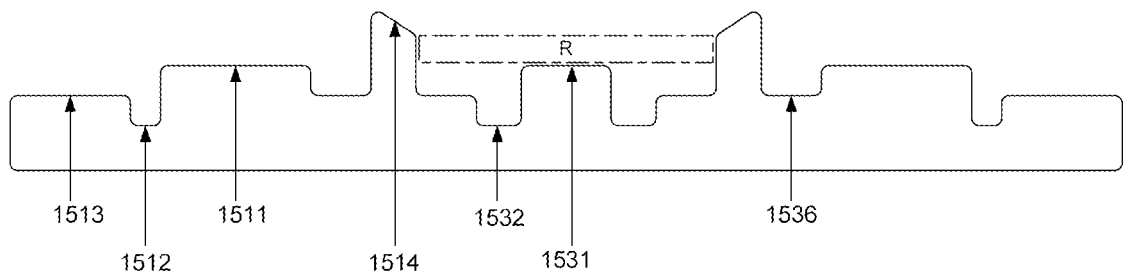
FIG. 15B is a cross-sectional view of the base along C-C' according to some embodiments of the instant disclosure.

FIG. 15B is a cross-sectional view of the base along C-C' according to some embodiments of the instant disclosure. In some embodiments, the pair of positioning members 1514 have heads shaped to decline inward towards the position of the reticle R to guide the reticle R during placement. In some embodiments, the height (from a bottom surface of the base) of the buffer rim 1536 of the positioning structure and the outer region 1513 may be substantially the same. In some embodiments, the height of the bottom of the guide trench structure 1532 and the bottom of the peripheral trench structure 1512 may be substantially the same. In some embodiments, the height of the inner region 1511 and the support member 1531 may be substantially the same. In some embodiments, the height of the inner region 1511 is greater than the height of the buffer rim 1536 of the positioning structure, the outer region 1513, the bottom of the guide trench structure 1532, and the bottom of the peripheral trench structure 1512. In some embodiments, the height of the buffer rim 1536 of the positioning structure and the outer region 1513 is greater than the height of the bottom of the guide trench structure 1532 and the bottom of the peripheral trench structure 1512.

In the illustrated embodiment, the guide trench structure 1532 around the support member 1531 and the buffer rim 1536 around each of the positioning member 1514 are arranged in fluid communication with each other, and cooperatively generate a stair sectional profile. In some embodiments, the sectional area below the support member 1531 (e.g., below a top surface at the center region of the support member 1531) and between one of the positioning member 1514 (e.g., as substantially indicated by the shaded region under a received workpiece R) is configured to meet a sufficient clearance threshold. For one thing, a sufficiently large cross-sectional trench gap between the protruding members (and under a received workpiece R) may facilitate the induction of gas flow around the support member 1531 and promote the generation of vortex at the corner region, thereby enhancing particle trapping during operation of the pod system. In some embodiments, the sectional area between the support member 1531 and one of the positioning member 1514 is no less than 25 mm^2.

Figure 16:
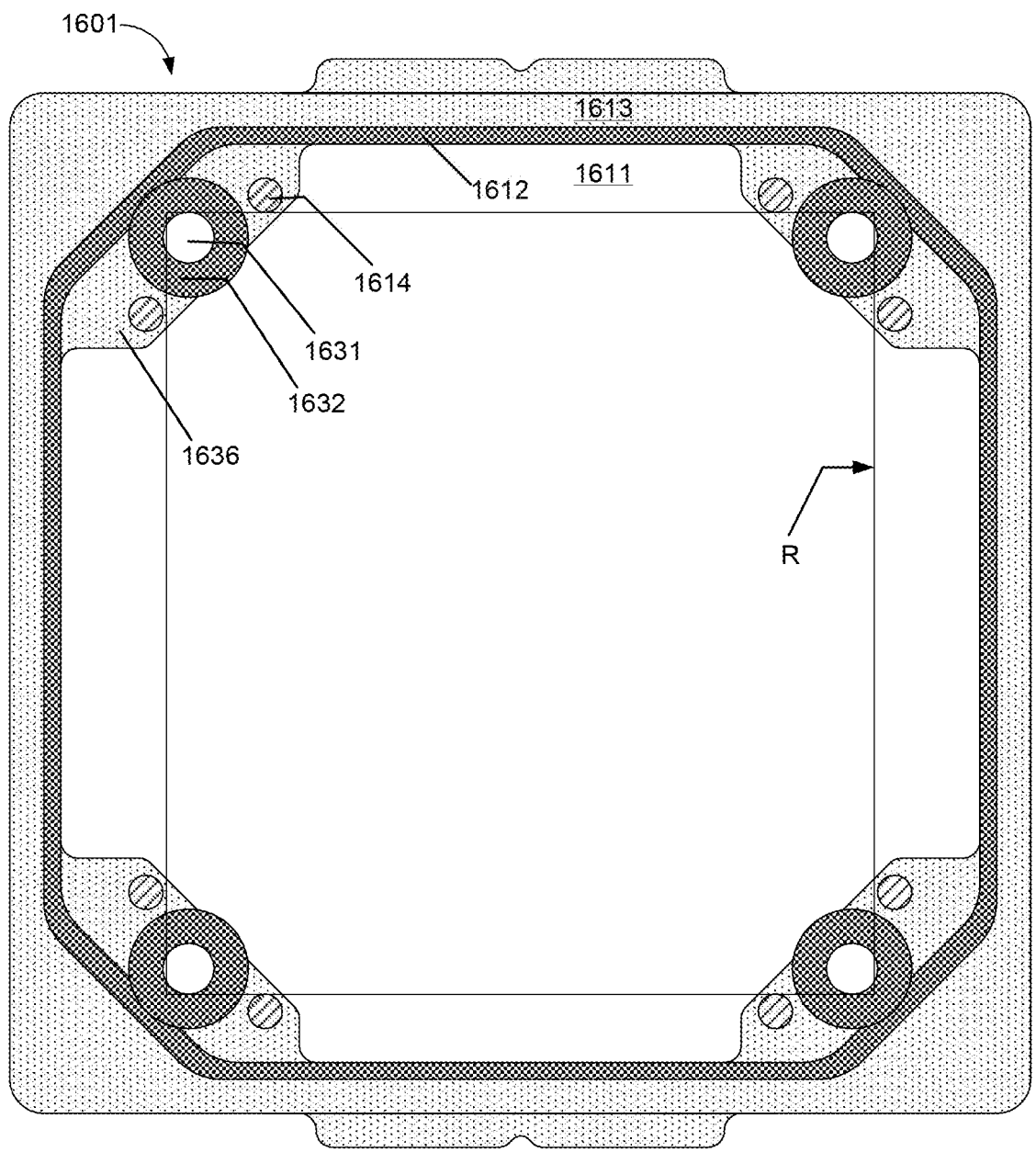
FIG. 16 is a perspective view of the base according to some embodiments of the instant disclosure.

FIG. 16 is a plane view of the base 1601 according to some embodiments of the instant disclosure. The base includes an upper surface and a bottom surface opposite the upper surface. The upper surface of the base 1601 may include an inner region 1611 and an outer region 1613. In some embodiments, the inner region 1611 is substantially planar to the outer region 1613. In some other embodiments, the inner region 1611 is higher than the outer region 1613. The base 1601 includes a plurality of positioning structures.

Each positioning structure includes a pair of positioning members 1614, a support member 1631 disposed between the pair of positioning members 1614, and a guide trench structure 1632 surrounding the support member 1631. The pair of positioning members 1614 may be used to position a corner of a workpiece R placed in the reticle pod. The pair of positioning members 1614 respectively protrudes from the upper surface of the base 1601.

In some embodiments, the positioning structure further includes a buffer rim 1636 formed around the guide trench structure 1632. In some embodiments, the buffer rim 1636 of the positioning structure may be lower than the inner region 1611. In some embodiments, the buffer rim 1636 of the positioning structure may be planar to the outer region 1613. In some embodiments, the pair of positioning members 1614 protrudes from the buffer rim 1636. In some embodiments, the support member 1631 may have a height from the bottom surface of the base less than the height of the positioning members 1614 from the bottom surface of the base. In some embodiments, the support member 1631 may be substantially planar to the inner region 1611. In some embodiments, the support member 1631 may have a height greater than the inner region 1611. However, the protrusion of the support member 1631 from the inner region 1611 may not impede the stability of the workpiece R within the base 1601.

The guide trench structure 1632 surrounding the pair of positioning members 1614 and the support member 1631 has wall(s) with rounded contour. The guide trench structure 1632 further has a bottom surrounded by the wall. In some embodiments, the portion of the wall of the guide trench structure 1632 closest to the inner region 1611 is rounded to guide the direction of particles vacuumed into the base right back out of the base. The bottom of the guide trench structure 1632 may have a height from the bottom surface of the base 1601 less than the height of the inner region 1611 from the bottom surface of the base 1601. In some embodiments, the base 1601 further includes a peripheral trench structure 1612 disposed between the inner region 1611 and the outer region 1613. In some embodiments, the peripheral trench structure 1612 has an enclosed planar loop profile.

The peripheral trench structure 1612 in FIG. 16 provides a physical division between the inner region 1611 and the outer region 1613. In some embodiments, the plurality of positioning structures may be disposed between the inner region 1611 and the peripheral trench structure 1612. Furthermore, a portion of the guide trench structure 1632 may intersect with the peripheral trench structure 1612. In some embodiments, the portion of the guide trench structure 1632 is adjoining with the peripheral trench structure 1612. In some embodiments, the outer region of a cover may be in physical contact with the outer region 1613 when the cover is disposed over the base 1601.

In some embodiments, the planar shape of the peripheral trench structure 1612 may be different from the planar shape of the base 1601. In an exemplary embodiment, the planar shape of the base 1601 may be a quadrilateral shape such as a square or a rectangle. Whereas, the planar shape of the planar shape of the peripheral trench structure 1612 may be polygonal shape to prevent the existence of sharp corners. In this way, the probability of particles being trapped in the corners of the peripheral trench structure 1612 is reduced.

Figure 17:
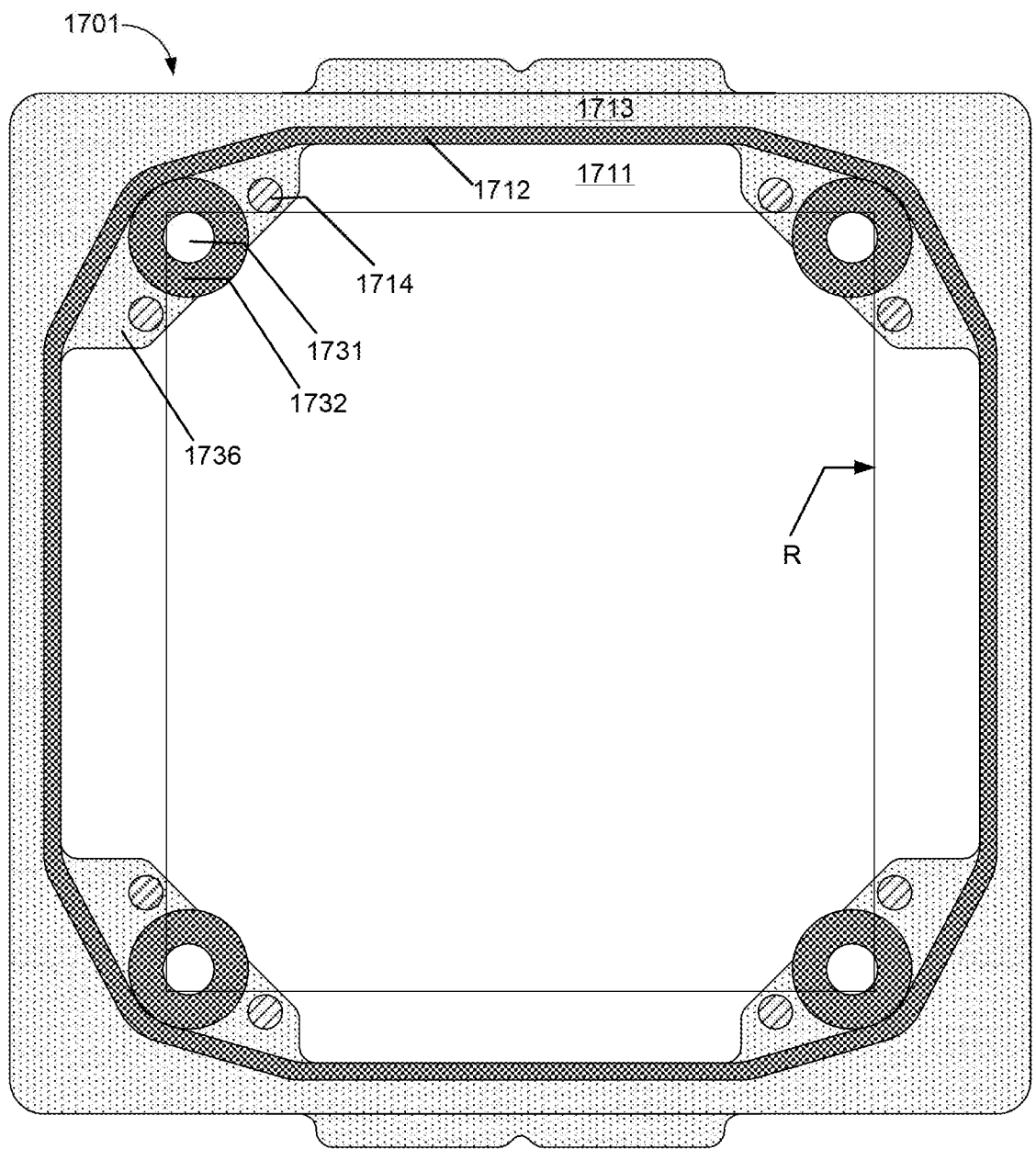
FIG. 17 is a perspective view of the base according to some embodiments of the instant disclosure.

FIG. 17 is a perspective view of the base 1701 according to some embodiments of the instant disclosure. The base includes an upper surface and a bottom surface opposite the upper surface. The upper surface of the base may include an inner region 1711 and an outer region 1713. In some embodiments, the inner region 1711 is substantially planar to the outer region 1713. In some other embodiments, the inner region 1711 is higher than the outer region 1713.

The base 1701 includes a plurality of positioning structures. Each positioning structure includes a pair of positioning members 1714, a support member 1731 disposed between the pair of positioning members 1714, and a guide trench structure 1732 surrounding the support member 1731. The pair of positioning members 1714 may be used to position a corner of a workpiece R placed in the reticle pod. The pair of positioning members 1714 are protruding from the upper surface. In some embodiments, the positioning structure further includes a buffer rim 1736 formed around the guide trench structure 1732. In some embodiments, the buffer rim 1736 of the positioning structure may be lower than the inner region 1711. In some embodiments, the buffer rim 1736 of the positioning structure may be planar to the outer region 1713. In some embodiments, the pair of positioning members 1714 is protruding from the buffer rim 1736. In some embodiments, the support member 1731 may have a height from the bottom surface of the base less than the height of the positioning members 1714 from the bottom surface of the base. In some embodiments, the support member 1731 may be substantially planar to the inner region 1711. In some embodiments, the support member 1731 may have a height greater than the inner region 1711. However, the protrusion of the support member 1731 from the inner region 1711 does not impede the stability of the workpiece R within the base 1701.

The guide trench structure 1732 has wall that has rounded contour to surround the pair of positioning members 1714 and the support member 1731. The guide trench structure 1732 further has a bottom surrounded by the wall. In some embodiments, the portion of the wall of the guide trench structure 1732 closest to the inner region 1711 is rounded to guide the direction of particles vacuumed into the base right back out of the base. The bottom of the guide trench structure 1732 may have a height from the bottom surface of the base less than the height of the inner region 1711 from the bottom surface of the base 1701. In some embodiments, the base 1701 further includes a peripheral trench structure 1712 disposed between the inner region 1711 and the outer region 1713. In some embodiments, the peripheral trench structure 1712 has an enclosed planar loop profile.

The peripheral trench structure 1712 in FIG. 17 provides a physical division between the inner region 1711 and the outer region 1713. In some embodiments, the plurality of positioning structures may be disposed between the inner region 1711 and the peripheral trench structure 1712. Furthermore, a portion of the guide trench structure 1732 may intersect the peripheral trench structure 1712. In some embodiments, the portion of the guide trench structure 1732 is adjoining with the peripheral trench structure 1712. In some embodiments, the outer region of a cover may be in physical contact with the outer region 1713 when the cover is disposed over the base.

In some embodiments, the planar shape of the peripheral trench structure 1712 may be different from the planar shape of the base 1701. In an exemplary embodiment, the planar shape of the base 1701 may be a quadrilateral shape such as a square or a rectangle. Whereas, the planar shape of the peripheral trench structure 1712 may be annular shape to prevent having corners. In this way, the probability of particles being trapped in the corners of the peripheral trench structure 1712 is reduced.

Figure 18:
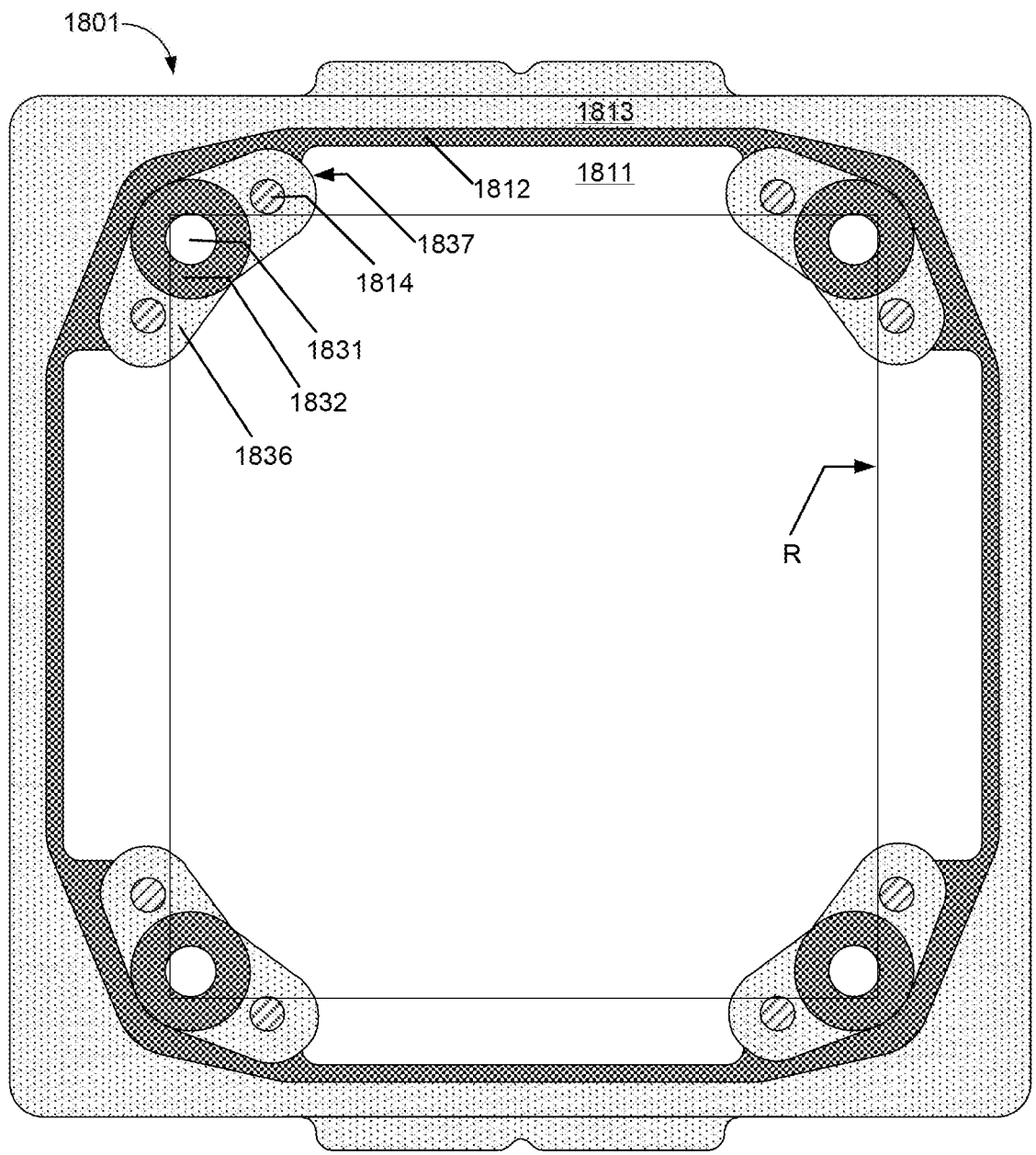
FIG. 18 is a perspective view of the base according to some embodiments of the instant disclosure.

FIG. 18 is a perspective view of the base 1801 according to some embodiments of the instant disclosure. The base includes an upper surface and a bottom surface opposite the upper surface. The upper surface of the base may include an inner region 1811 and an outer region 1813. In some embodiments, the inner region 1811 is substantially planar to the outer region 1813. In some other embodiments, the inner region 1811 is higher than the outer region 1813.

The base 1801 includes a plurality of positioning structures. Each positioning structure includes a pair of positioning members 1814, a support member 1831 disposed between the pair of positioning members 1814, and a guide trench structure 1832 surrounding the support member 1831. The pair of positioning members 1814 may be used to position a corner of a workpiece R placed in the reticle pod. The pair of positioning members 1814 are protruding from the upper surface. In some embodiments, the positioning structure further includes a buffer rim 1836 formed around the guide trench structure 1832. In some embodiments, the buffer rim 1836 of the positioning structure may be lower than the inner region 1811. In this way, a wall 1837 between the buffer rim 1836 of the positioning structure and the inner region 1811 formed. The wall 1837 may be rounded in planar profile. The wall 1837 is further used to prevent particles from reaching the workpiece R. The rounded shape of the wall 1837 is further configured to guide a local gas flow direction out of the base 1801. In some embodiments, the buffer rim 1836 of the positioning structure may be planar to the outer region 1813. In some embodiments, the pair of positioning members 1814 respectively protrudes from the buffer rim 1836. In some embodiments, the support member 1831 may have a height from the bottom surface of the base less than the height of the positioning members 1814 from the bottom surface of the base. In some embodiments, the support member 1831 may be substantially planar to the inner region 1811. In some embodiments, the support member 1831 may have a height greater than the inner region 1811. However, the protrusion of the support member 1831 from the inner region 1811 does not impede the stability of the workpiece R within the base 1801.

The guide trench structure 1832 has wall that has rounded contour to surround the pair of positioning members 1814 and the support member 1831. The guide trench structure 1832 further has a bottom surrounded by the wall. In some embodiments, the portion of the wall of the guide trench structure 1832 closest to the inner region 1811 is rounded to guide the direction of particles vacuumed into the base right back out of the base in the same way as the wall 1837. The bottom of the guide trench structure 1832 may have a height from the bottom surface of the base less than the height of the inner region 1811 from the bottom surface of the base 1801. In some embodiments, the base 1801 further includes a peripheral trench structure 1812 disposed between the inner region 1811 and the outer region 1813. In some embodiments, the peripheral trench structure 1812 has an enclosed planar loop profile. The peripheral trench structure 1812 in FIG. 18 forms a division between the inner region 1811 and the outer region 1813.

In some embodiments, the plurality of positioning structures may be disposed between the inner region 1811 and the peripheral trench structure 1812. Furthermore, a portion of the guide trench structure 1832 may intersect with the peripheral trench structure 1812. In some embodiments, the portion of the guide trench structure 1832 is adjoining with the peripheral trench structure 1812. In some embodiments, the outer region of a cover may be in physical contact with the outer region 1813 when the cover is disposed over the base. In some embodiments, the planar shape of the peripheral trench structure 1812 may be different to the planar shape of the base 1801. In an exemplary embodiment, the planar shape of the base 1801 may be a quadrilateral shape such as a square or a rectangle. Whereas, the planar shape of the planar shape of the peripheral trench structure 1812 may be annular shape to prevent having corners. In this way, the probability of particles being trapped in the corners of the peripheral trench structure 1812 is reduced.

Figure 19:
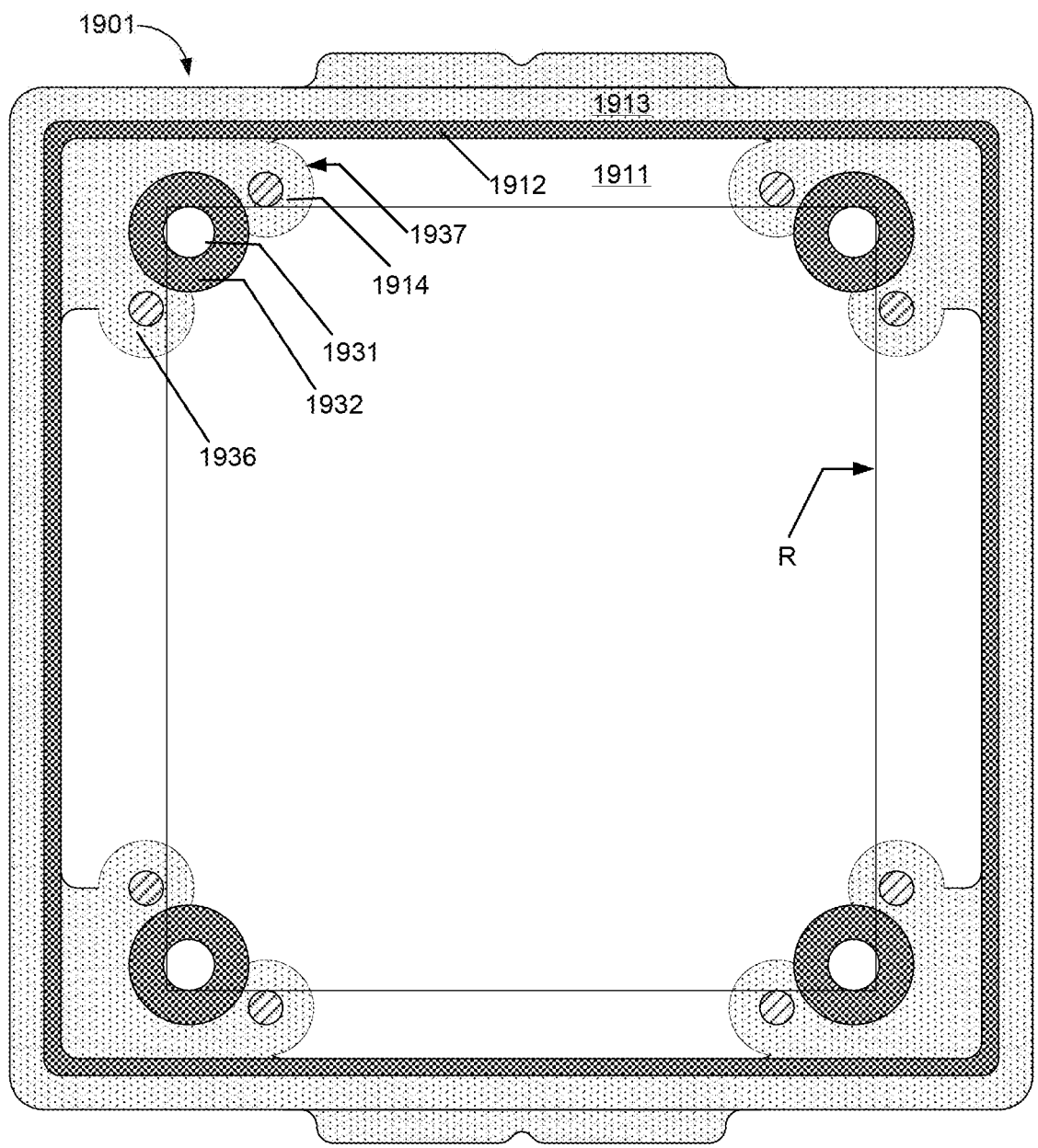
FIG. 19 is a perspective view of the base according to some embodiments of the instant disclosure.

FIG. 19 is a perspective view of the base 1901 according to some embodiments of the instant disclosure. The base includes an upper surface and a bottom surface opposite the upper surface. The upper surface of the base may include an inner region 1911 and an outer region 1913. In some embodiments, the inner region 1911 is substantially planar to the outer region 1913. In some other embodiments, the inner region 1911 is higher than the outer region 1913.

The base 1901 includes a plurality of positioning structures. Each positioning structure includes a pair of positioning members 1914, a support member 1931 disposed between the pair of positioning members 1914, and a guide trench structure 1932 surrounding the support member 1931. The pair of positioning members 1914 may be used to position a corner of a workpiece R placed in the reticle pod. The pair of positioning members 1914 are protruding from the upper surface. In some embodiments, the positioning structure further includes a buffer rim 1936 formed around the guide trench structure 1932. In some embodiments, the buffer rim 1936 of the positioning structure may be lower than the inner region 1911. In this way, a wall 1937 between the buffer rim 1936 of the positioning structure and the inner region 1911 formed. The wall 1937 may be rounded in planar profile. The wall 1937 is further used to prevent particles from reaching the workpiece R. The rounded shape of the wall 1937 is further used to guide the direction out of the base 1901. In an exemplary embodiment, the wall 1937 is formed to have an arc shape profile. In some embodiments, the buffer rim 1936 of the positioning structure may be planar to the outer region 1913. In some embodiments, the pair of positioning members 1914 is protruding from the buffer rim 1936. In some embodiments, the support member 1931 may have a height from the bottom surface of the base less than the height of the positioning members 1914 from the bottom surface of the base. In some embodiments, the support member 1931 may be substantially planar to the inner region 1911. In some embodiments, the support member 1931 may have a height greater than the inner region 1911. However, the protrusion of the support member 1931 from the inner region 1911 does not impede the stability of the workpiece R within the base 1901.

The guide trench structure 1932 has wall that has rounded contour to surround the pair of positioning members 1914 and the support member 1931. The guide trench structure 1932 further has a bottom surrounded by the wall. In some embodiments, the portion of the wall of the guide trench structure 1932 closest to the inner region 1911 is rounded to guide the direction of particles vacuumed into the base right back out of the base. The bottom of the guide trench structure 1932 may have a height from the bottom surface of the base less than the height of the inner region 1911 from the bottom surface of the base. In some embodiments, the base 1901 further includes a peripheral trench structure 1912 disposed between the inner region 1911 and the outer region 1913.

The peripheral trench structure 1912 in FIG. 19 forms a division between the inner region 1911 and the outer region 1913. In some embodiments, the peripheral trench structure 1912 has an enclosed planar loop profile. In some embodiments, the plurality of positioning structures may be disposed between the inner region 1911 and the peripheral trench structure 1912. Furthermore, the guide trench structure 1932 may be arranged at a distance from the peripheral trench structure 1912. In some embodiments, the outer region of a cover may be in physical contact with the outer region 1913 when the cover is disposed over the base. In some embodiments, the planar shape of the peripheral trench structure 1912 may be similar to the planar shape of the base 1901. In an exemplary embodiment, the planar shape of the base 1901 may be a quadrilateral shape such as a square or a rectangle. Thus, the planar shape of the planar shape of the peripheral trench structure 1912 may be a quadrilateral shape such as a square or a rectangle.

Figure 20:
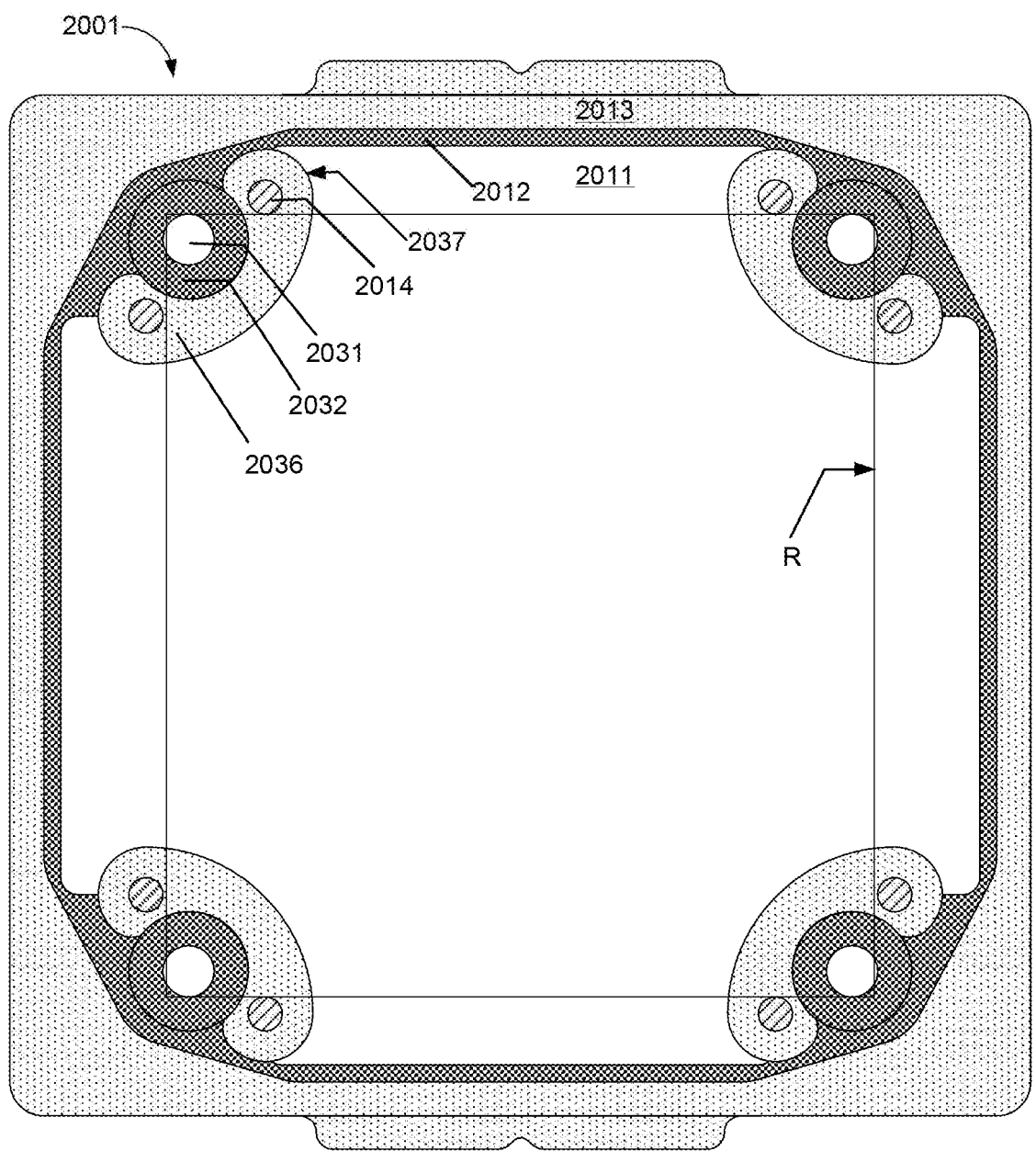
FIG. 20 is a perspective view of the base according to some embodiments of the instant disclosure.

FIG. 20 is a perspective view of the base 2001 according to some embodiments of the instant disclosure. The base includes an upper surface and a bottom surface opposite the upper surface. The upper surface of the base may include an inner region 2011 and an outer region 2013. In some embodiments, the inner region 2011 is substantially planar to the outer region 2013. In some other embodiments, the inner region 2011 is higher than the outer region 2013.

The base 2001 includes a plurality of positioning structures. Each positioning structure includes a pair of positioning members 2014, a support member 2031 disposed between the pair of positioning members 2014, and a guide trench structure 2032 surrounding the support member 2031. The pair of positioning members 2014 may be used to position a corner of a workpiece R placed in the reticle pod. The pair of positioning members 2014 are protruding from the upper surface. In some embodiments, the positioning structure further includes a buffer rim 2036 formed around the guide trench structure 2032. In some embodiments, the buffer rim 2036 of the positioning structure may be lower than the inner region 2011. In this way, a wall 2037 between the buffer rim 2036 of the positioning structure and the inner region 2011 formed. The wall 2037 may be rounded in planar profile. The wall 2037 is further used to prevent particles from reaching the workpiece R. The rounded shape of the wall 2037 is further used to guide the direction out of the base 2001. In some embodiments, the buffer rim 2036 of the positioning structure may be planar to the outer region 2013. In some embodiments, the pair of positioning members 2014 is protruding from the buffer rim 2036. In some embodiments, the support member 2031 may have a height from the bottom surface of the base less than the height of the positioning members 2014 from the bottom surface of the base. In some embodiments, the support member 2031 may be substantially planar to the inner region 2011. In some embodiments, the support member 2031 may have a height greater than the inner region 2011. However, the protrusion of the support member 2031 from the inner region 2011 does not impede the stability of the workpiece R within the base 2001.

The guide trench structure 2032 has wall that has rounded contour to surround the pair of positioning members 2014 and the support member 2031. The guide trench structure 2032 further has a bottom surrounded by the wall. In some embodiments, the portion of the wall of the guide trench structure 2032 closest to the inner region 2011 is rounded to guide the direction of particles vacuumed into the base right back out of the base in the same way as the wall 2037. The bottom of the guide trench structure 2032 may have a height from the bottom surface of the base less than the height of the inner region 2011 from the bottom surface of the base 2001.

In some embodiments, the base 2001 further includes a peripheral trench structure 2012 disposed between the inner region 2011 and the outer region 2013. In some embodiments, the peripheral trench structure 2012 has an enclosed planar loop profile. The peripheral trench structure 2012 in FIG. 20 shows a division between the inner region 2011 and the outer region 2013. In some embodiments, the plurality of positioning structures may be disposed between the inner region 2011 and the peripheral trench structure 2012. Furthermore, a portion of the guide trench structure 2032 may intersect with the peripheral trench structure 2012. In some embodiments, the portion of the guide trench structure 2032 is adjoining with the peripheral trench structure 2012. Furthermore, the guide trench structure 2032 may be at a distance from the inner region 2011. The buffer rim 2036 of the positioning structure is arranged between the guide trench structure 2032 and the inner region 2011. In some embodiments, the outer region of a cover may be in physical contact with the outer region 2013 when the cover is disposed over the base.

In some embodiments, the planar shape of the peripheral trench structure 2012 may be different to the planar shape of the base 2001. In an exemplary embodiment, the planar shape of the base 2001 may be a quadrilateral shape such as a square or a rectangle. Whereas, the planar shape of the planar shape of the peripheral trench structure 2012 may be annular shape to prevent having corners. In this way, the probability of particles being trapped in the corners of the peripheral trench structure 2012 is reduced.

Figure 21:
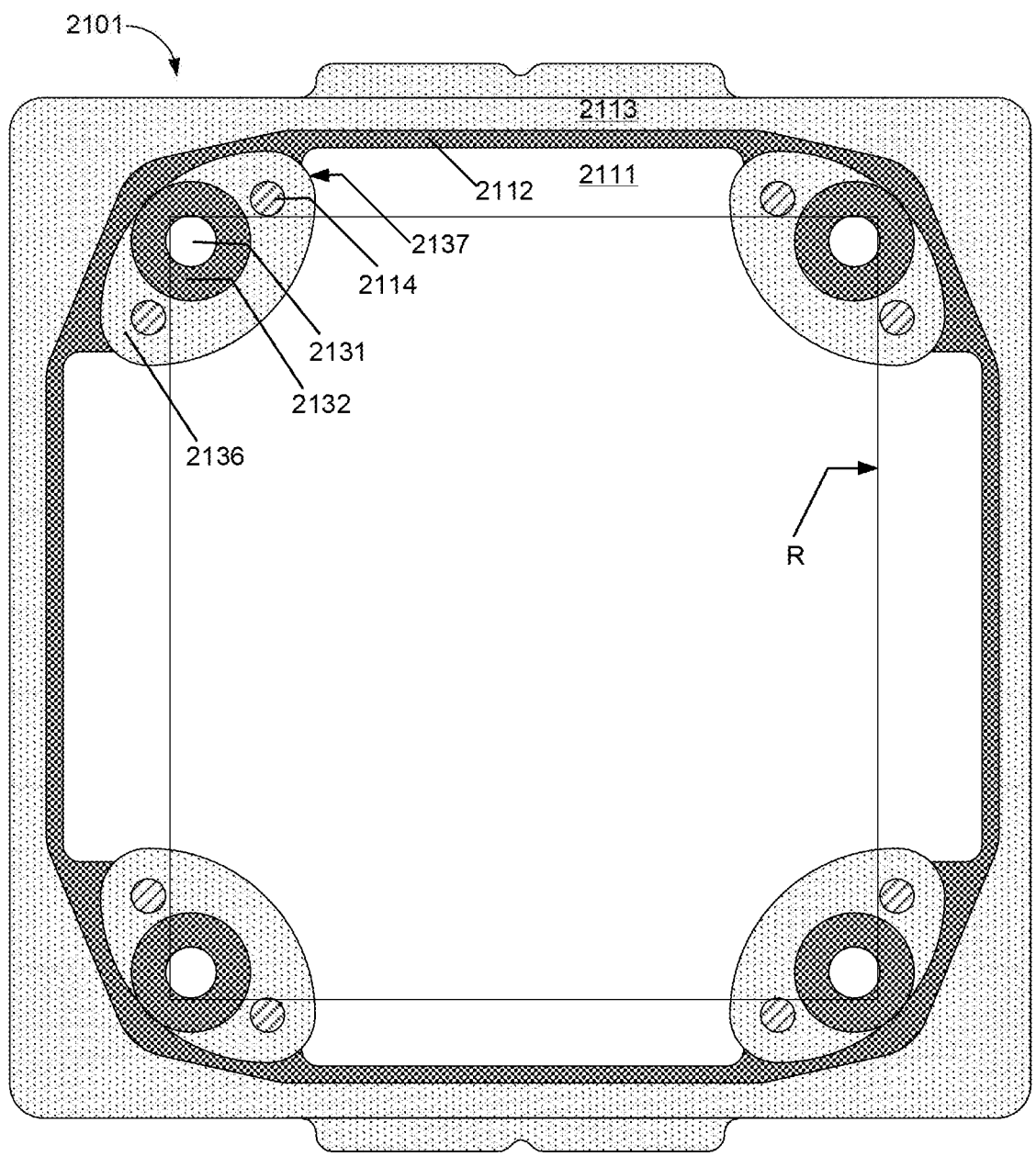
FIG. 21 is a perspective view of the base according to some embodiments of the instant disclosure.

FIG. 21 is a perspective view of the base 2101 according to some embodiments of the instant disclosure. The base includes an upper surface and a bottom surface opposite the upper surface. The upper surface of the base may include an inner region 2111 and an outer region 2113. In some embodiments, the inner region 2111 is substantially planar to the outer region 2113. In some other embodiments, the inner region 2111 is higher than the outer region 2113. The base 2101 includes a plurality of positioning structures. The positioning structures may have oval planar shape.

Each positioning structure includes a pair of positioning members 2114, a support member 2131 disposed between the pair of positioning members 2114, and a guide trench structure 2132 surrounding the support member 2131. The pair of positioning members 2014 may be used to position a corner of a workpiece R placed in the reticle pod. The pair of positioning members 2114 are protruding from the upper surface. In some embodiments, the positioning structure further includes a buffer rim 2136 formed around the guide trench structure 2132. In some embodiments, the buffer rim 2136 of the positioning structure may be lower than the inner region 2111. In this way, a wall 2137 between the buffer rim 2136 of the positioning structure and the inner region 2111 formed. The wall 2137 may be rounded in planar profile. The wall 2137 is further used to prevent particles from reaching the workpiece R. The rounded planar profile of the wall 2137 is further used to guide the direction out of the base 2101. In some embodiments, the buffer rim 2136 of the positioning structure may be planar to the outer region 2113. In some embodiments, the pair of positioning members 2114 is protruding from the buffer rim 2136. In some embodiments, the support member 2131 may have a height from the bottom surface of the base less than the height of the positioning members 2114 from the bottom surface of the base. In some embodiments, the support member 2131 may be substantially planar to the inner region 2111. In some embodiments, the support member 2131 may have a height greater than the inner region 2111. However, the protrusion of the support member 2131 from the inner region 2111 does not impede the stability of the workpiece R within the base 2101.

The guide trench structure 2132 has wall that has rounded contour to surround the pair of positioning members 2114 and the support member 2131. The guide trench structure 2132 further has a bottom surrounded by the wall. In some embodiments, the portion of the wall of the guide trench structure 2132 closest to the inner region 2111 is rounded to guide the direction of particles vacuumed into the base right back out of the base in the same way as the wall 2137. The bottom of the guide trench structure 2132 may have a height from the bottom surface of the base less than the height of the inner region 2111 from the bottom surface of the base 2101. In some embodiments, the base 2101 further includes a peripheral trench structure 2112 disposed between the inner region 2111 and the outer region 2013. In some embodiments, the peripheral trench structure 2112 has an enclosed planar loop profile.

The peripheral trench structure 2112 in FIG. 21 forms a division between the inner region 2111 and the outer region 2113. In some embodiments, the plurality of positioning structures may be disposed between the inner region 2111 and the peripheral trench structure 2112. Moreover, a portion of the guide trench structure 2132 may intersect with the peripheral trench structure 2112. In some embodiments, the portion of the guide trench structure 2132 is adjoining with the peripheral trench structure 2112. Furthermore, the guide trench structure 2132 may be arranged at a distance from the inner region 2111. The buffer rim 2136 of the positioning structure is in between the guide trench structure 2132 and the inner region 2111. In some embodiments, the outer region of a cover may be in physical contact with the outer region 2113 when the cover is disposed over the base.

In some embodiments, the planar shape of the peripheral trench structure 2112 may be different from the planar shape of the base 2101. In an exemplary embodiment, the planar shape of the base 2101 may be a quadrilateral shape such as a square or a rectangle. Whereas, the planar shape of the planar shape of the peripheral trench structure 2112 may be annular shape to prevent having corners. In this way, the probability of particles being trapped in the corners of the peripheral trench structure 2112 is reduced.

In all of the above mentioned embodiments, elements of the base may be interchangeable with each other. In the embodiments, the wall of guide trench structure formed nearest to the center of the base may be configured with a rounded planar profile to guide the unwanted particles out of the base. In some embodiments, the guide trench structure is circular loop in shape where only the support member is surrounded by the guide trench structure. In some embodiments, the guide trench structure is formed by a combination of a plurality of arc shaped walls continuously coupled to each other where the support member and the pair of positioning members are surrounded by the guide trench structure. In some embodiments, the guide trench structure is formed within the inner region of the base. In some embodiments, the guide trench structure is formed between the inner region and the outer region of the base. In some embodiments, the guide trench structure is at a distance from the inner region, wherein a buffer rim is disposed between the guide trench structure and the inner region of the base. In some other embodiments, the guide trench structure is at a distance from the peripheral trench structure, wherein a buffer rim is disposed between the guide trench structure and the peripheral trench structure. In the same way as the guide trench structure, the shape of the peripheral trench structure in the embodiments are also interchangeable. In some embodiments, the peripheral trench structure follows the shape of the base. In some embodiments, the peripheral trench structure has a quadrilateral shape such as a square or a rectangle. In some other embodiments, the peripheral trench structure has a polygonal shape. In further embodiments, the peripheral trench structure has an annular shape to reduce corners that may cause particle retention. In further embodiments, the peripheral trench structure has a planar shape that contours to the planar shape of the base. In further embodiments, portions of the peripheral trench structure are indented towards the center of the base.

Accordingly, one aspect of the instant disclosure provides a pod for receiving a workpiece that comprises a base having an upper surface, a plurality of positioning members disposed on and protruded from the upper surface. The upper surface comprises a carrying surface defined on the upper surface, above which the workpiece is carried when the workpiece is received; a peripheral trench structure having an enclosed planar loop profile, wherein a bottom of the peripheral trench structure is lower than the carrying surface; and a first contacting surface, wherein the carrying surface, the peripheral trench structure, and the first contacting surface are sequentially distributed from a center towards an edge of the upper surface, and the first contacting surface is lower than the carrying surface, and the bottom of the peripheral trench structure is lower than the first contacting surface.

In some embodiments, the peripheral trench structure having the enclosed planar loop profile surrounds the carrying surface.

In some embodiments, the peripheral trench structure having the enclosed loop planar profile surrounds a pair of the positioning members.

In some embodiments, the base further comprises a support member disposed between a pair of the plurality of positioning members, and a guide trench structure surrounding the support member.

In some embodiments, the guide trench structure further extends around the pair of positioning members.

In some embodiments, the guide trench structure is disposed between the carrying surface and the peripheral trench structure.

In some embodiments, the guide trench structure is disposed between the first contacting surface and the carrying surface, and is intersecting with the peripheral trench structure.

In some embodiments, a portion of a wall of the guide trench structure closest to the carrying surface is rounded.

Accordingly, another aspect of the instant disclosure provides a pod for receiving a workpiece that comprises a base having an upper surface and a bottom surface opposite the upper surface, and a positioning structure disposed around the inner region. The upper surface of the base includes an inner region formed in a center portion of the base; and an outer region surrounding the inner region. The positioning structure includes a pair of positioning members protruding from the upper surface; a support member disposed between the pair of positioning members; and a guide trench structure surrounding the support member.

In some embodiments, a height of the outer region from the bottom surface is no greater than a height of the inner region from the bottom surface.

In some embodiments, the upper surface of the base further includes a peripheral trench structure disposed between the inner region and the outer region. A height of a bottom of the peripheral trench structure from the bottom surface of the base is less than a height of the outer region from the bottom surface and a height of the inner region from the bottom surface.

In some embodiments, the guide trench structure is disposed between the inner region and the peripheral trench structure.

In some embodiments, the guide trench structure intersects the peripheral trench structure.

In some embodiments, the guide trench structure further extends around the pair of positioning members.

In some embodiments, a planar pattern of the guide trench structure surrounding the support member has a rounded contour.

Accordingly, another aspect of the instant disclosure provides a pod that comprises a base having a plurality of corners; a pair of positioning members arranged around one of the plurality of corners and protruding from the base; a support member disposed between the pair of positioning members; and a guide trench structure disposed around the support member having a rounded planar profile.

In some embodiments, an inner region of the base has a height greater than an outer region of the base.

In some embodiments, the pair of positioning members protrude from the outer region of the base.

In some embodiments, the guide trench structure is formed in the outer region of the base.

In some embodiments, the pod further comprising a buffer rim arranged between the guide trench structure and the inner region.

The ordinal numbers used in the detailed description and claims, such as "first" and "second" do not necessarily indicate their priority orders or up and down directions; on the contrary, they are merely intended to distinguish different elements. It will be apparent to those skilled in the art that various modifications and variations can be made to the structure of the instant disclosure without departing from the scope or spirit of the disclosure. In view of the foregoing, it is intended that the instant disclosure covers modifications and variations of this disclosure, provided they fall within the scope of the following claims.

What is claimed is:

1. A pod for receiving a workpiece, the pod comprising:
a base having an upper surface, a plurality of positioning members disposed on and protruding from the upper surface, the upper surface comprising:
a carrying surface defined on the upper surface, above which the workpiece is carried when the workpiece is received;
a peripheral trench structure having an enclosed planar loop profile, wherein a bottom of the peripheral trench structure is lower than the carrying surface; and
a first contacting surface, wherein the carrying surface, the peripheral trench structure, and the first contacting surface are sequentially distributed from a center towards an edge of the upper surface, and the first contacting surface is lower than the carrying surface, and the bottom of the peripheral trench structure is lower than the first contacting surface.

2. The pod of claim 1, wherein the peripheral trench structure having the enclosed planar loop profile surrounds the carrying surface.

3. The pod of claim 1, wherein the peripheral trench structure having the enclosed loop planar profile surrounds a pair of the plurality of positioning members.

4. The pod of claim 1, wherein the base further comprises:
a support member disposed between a pair of the plurality of positioning members; and
a guide trench structure surrounding the support member.

5. The pod of claim 4, wherein the guide trench structure further extends around the pair of the plurality of positioning members.

6. The pod of claim 4, wherein the guide trench structure is disposed between the carrying surface and the peripheral trench structure.

7. The pod of claim 4, wherein the guide trench structure is disposed between the first contacting surface and the carrying surface, and intersect the peripheral trench structure.

8. The pod of claim 4, wherein a portion of a wall of the guide trench structure closest to the carrying surface is rounded.

9. A pod for receiving a workpiece, the pod comprising:
a base having an upper surface and a bottom surface opposite the upper surface, wherein the upper surface of the base includes:
an inner region formed in a center portion of the base;
an outer region surrounding the inner region; and
a peripheral trench structure disposed between the inner region and the outer region,
wherein a height of a bottom of the peripheral trench structure from the bottom surface of the base is less than a height of the outer region from the bottom surface of the base and a height of the inner region from the bottom surface of the base;
a positioning structure disposed around the inner region, wherein the positioning structure includes:
a pair of positioning members protruding from the upper surface;
a support member disposed between the pair of positioning members; and
a guide trench structure surrounding the support member.

10. The pod of claim 9, wherein the height of the outer region from the bottom surface of the base is no greater than the height of the inner region from the bottom surface of the base.

11. The pod of claim 9, wherein the guide trench structure is disposed between the inner region and the peripheral trench structure.

12. The pod of claim 9, wherein the guide trench structure intersects the peripheral trench structure.

13. The pod of claim 9, wherein the guide trench structure further extends around the pair of positioning members.

14. The pod of claim 9, wherein a planar pattern of the guide trench structure surrounding the support member has a rounded contour.

15. A pod, comprising:
a base having a plurality of corners;
a pair of positioning members arranged around one of the plurality of corners and protruding from the base;
a support member disposed between the pair of positioning members; and
a guide trench structure disposed around the support member, the guide trench structure having a rounded planar profile, wherein the guide trench structure is formed in an outer region of the base;
a buffer rim arranged between the guide trench structure and an inner region of the base, wherein the inner region of the base has a height greater than the outer region of the base.

16. The pod of claim 15, wherein the pair of positioning members protrude from the outer region of the base.

* * * * *